US012740271B2

(12) United States Patent
Yan et al.

(10) Patent No.: US 12,740,271 B2
(45) Date of Patent: Sep. 15, 2026

(54) ARRAY SUBSTRATE AND DISPLAY APPARATUS

(71) Applicants: Chengdu BOE Optoelectronics Technology Co., Ltd., Chengdu (CN); BOE Technology Group Co., Ltd., Beijing (CN)

(72) Inventors: Zhenglong Yan, Beijing (CN); Yanyang Shang, Beijing (CN); Zhu Wang, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 372 days.

(21) Appl. No.: 18/690,031

(22) PCT Filed: Mar. 28, 2023

(86) PCT No.: PCT/CN2023/084255

§ 371 (c)(1),
(2) Date: Mar. 7, 2024

(87) PCT Pub. No.: WO2024/197556

PCT Pub. Date: Oct. 3, 2024

(65) Prior Publication Data

US 2025/0228085 A1 Jul. 10, 2025

(51) Int. Cl.
*H10K 59/131* (2023.01)
*H10K 59/40* (2023.01)

(52) U.S. Cl.
CPC ........... *H10K 59/131* (2023.02); *H10K 59/40* (2023.02)

(58) Field of Classification Search
CPC ............................ H10K 59/131; H10K 59/40
See application file for complete search history.

(56) References Cited

U.S. PATENT DOCUMENTS

| | | | |
|---|---|---|---|
| 2021/0055831 | A1 | 2/2021 | Long |
| 2022/0147186 | A1 | 5/2022 | Bo |
| 2022/0320237 | A1 | 10/2022 | Liu et al. |

FOREIGN PATENT DOCUMENTS

| | | | |
|---|---|---|---|
| CN | 104965325 | A | 10/2015 |
| CN | 104991368 | A | 10/2015 |

(Continued)

OTHER PUBLICATIONS

International Search Report & Written Opinion mailed Nov. 30, 2023, regarding PCT/CN2023/084255.

*Primary Examiner* — Samuel A Gebremariam
(74) *Attorney, Agent, or Firm* — Intellectual Valley Law, P.C.

(57) ABSTRACT

An array substrate is provided. The array substrate includes a plurality of data lines; and a touch electrode layer including a plurality of first touch electrode lines and a plurality of second touch electrode lines on a side of the plurality of data lines away from a base substrate. The array substrate includes a plurality of line breaks where electrode lines of the plurality of first touch electrode lines discontinue. An orthographic projection of an insulating material in a respective line break on the base substrate overlaps with an orthographic projection of an individual data line of the plurality of data lines on the base substrate. Where a line break of the plurality of line breaks is present, an orthographic projection of a respective first touch electrode line on the base substrate is non-overlapping with the orthographic projection of the individual data line on the base substrate.

20 Claims, 29 Drawing Sheets

(56) References Cited

FOREIGN PATENT DOCUMENTS

| | | | |
|---|---|---|---|
| CN | 108227999 | A | 6/2018 |
| CN | 108549170 | A | 9/2018 |
| CN | 110471569 | A | 11/2019 |
| CN | 111367431 | A | 7/2020 |

ARRAY SUBSTRATE AND DISPLAY APPARATUS

CROSS-REFERENCE TO RELATED APPLICATION

This application is a national stage application under 35 U.S.C. § 371 of International Application No. PCT/CN2023/084255, filed Mar. 28, 2023, the contents of which are incorporated by reference in the entirety.

TECHNICAL FIELD

The present invention relates to display technology, more particularly, to an array substrate and a display apparatus.

BACKGROUND

Organic Light Emitting Diode (OLED) display is one of the hotspots in the field of flat panel display research today. OLED is driven by a driving current required to be kept constant to control illumination. The OLED display panel includes a plurality of pixel units configured with pixel-driving circuits arranged in multiple rows and columns.

SUMMARY

In one aspect, the present disclosure provides an array substrate, comprising a plurality of data lines; and a touch electrode layer comprising a plurality of touch electrode lines on a side of the plurality of data lines away from a base substrate; wherein the plurality of touch electrode lines comprise a plurality of first touch electrode lines extending along a direction substantially parallel to a first direction and a plurality of second touch electrode lines extending along a direction substantially parallel to a second direction; and the plurality of data lines extend along a direction substantially parallel to the second direction; wherein the array substrate comprises a plurality of line breaks where electrode lines of the plurality of first touch electrode lines discontinue; an orthographic projection of an insulating material in a respective line break of the plurality of line breaks on the base substrate overlaps with an orthographic projection of an individual data line of the plurality of data lines on the base substrate; and where a line break of the plurality of line breaks is present, an orthographic projection of a respective first touch electrode line of the plurality of first touch electrode lines on the base substrate is non-overlapping with the orthographic projection of the individual data line on the base substrate.

Optionally, the plurality of line breaks are arranged in an array of rows and columns.

Optionally, the plurality of first touch electrode lines are arranged in rows, including (2k−1)-th row R(2k−1), and (2k)-th row R(2k) of K rows, K and k being positive integers, $1 \leq k \leq (K/2)$; the plurality of data lines comprise a first adjacent data line and a second adjacent data line; an orthographic projection of the first adjacent data line on the base substrate at least partially overlaps with an orthographic projection of first touch electrode lines in the (2k)-th row R(2k) on the base substrate, and is non-overlapping with an orthographic projection of first touch electrode line in the (2k−1)-th row R(2k−1) on the base substrate; and an orthographic projection of the second adjacent data line on the base substrate at least partially overlaps with an orthographic projection of first touch electrode lines in the (2k−1)-th row R(2k−1) on the base substrate, and is non-overlapping with an orthographic projection of first touch electrode lines in the (2k)-th row R(2k) on the base substrate.

Optionally, the plurality of data lines further comprise a third adjacent data line; and an orthographic projection of the third adjacent data line on the base substrate at least partially overlaps with an orthographic projection of first touch electrode lines in the (2k)-th row R(2k) on the base substrate, and at least partially overlaps with an orthographic projection of first touch electrode lines in the (2k−1)-th row R(2k−1) on the base substrate.

Optionally, the first adjacent data line, the second adjacent data line, and the third adjacent data line are three data lines adjacent to each other.

Optionally, line breaks in a first touch electrode line in the (2k)-th row R(2k) and line breaks in a first touch electrode line in the (2k−1)-th row R(2k−1) are staggered with respect to each other.

Optionally, a portion of the respective first touch electrode line between two adjacent line breaks of the plurality of line breaks crosses over two data lines of the plurality of data lines; and an orthographic projection of the portion of the respective first touch electrode line between the two adjacent line breaks of the plurality of line breaks on the base substrate at least partially overlaps with an orthographic projection of two data lines of the plurality of data lines on the base substrate.

Optionally, the respective first touch electrode line comprises a first portion and a second portion spaced apart by a line break of the plurality of line breaks; an orthographic projection of the first portion and the second portion on the base substrate is non-overlapping with an orthographic projection of the individual data line on the base substrate, wherein the individual data line extends through a region having the line break; the first portion is spaced apart from the individual data line by a first minimum distance; the second portion is spaced apart from the individual data line by a second minimum distance; and the first minimum distance and the second minimum distance are greater than 0.5 μm.

Optionally, an orthographic projection of the plurality of second touch electrode lines on the base substrate is substantially non-overlapping with an orthographic projection of the plurality of data lines on the base substrate.

Optionally, the array substrate further comprises a plurality of voltage supply lines and a plurality of constant voltage signal lines; and wherein an orthographic projection of the plurality of second touch electrode lines on the base substrate at least partially overlaps with an orthographic projection of a combination of the plurality of voltage supply lines and the plurality of constant voltage signal lines on the base substrate.

Optionally, the plurality of second touch electrode lines comprise a plurality of first adjacent second touch electrode lines and a plurality of second adjacent second touch electrode lines alternately arranged; wherein an orthographic projection of a first adjacent second touch electrode line of the plurality of first adjacent second touch electrode lines on the base substrate is substantially covered by an orthographic projection of an individual voltage supply line of the plurality of voltage supply lines on the base substrate; and an orthographic projection of a second adjacent second touch electrode line of the plurality of second adjacent second touch electrode lines on the base substrate at least partially overlaps with an orthographic projection of an individual constant voltage signal line of the plurality of constant voltage signal lines on the base substrate.

Optionally, the respective first touch electrode line crosses over at least one voltage supply line of the plurality of voltage supply lines and crosses over at least one constant voltage signal line of the plurality of constant voltage signal lines.

Optionally, the array substrate further comprises a plurality of anodes; wherein an orthographic projection of the plurality of touch electrode lines on the base substrate is substantially non-overlapping with an orthographic projection of the plurality of anodes of a plurality of light emitting elements on the base substrate.

Optionally, the array substrate further comprises a plurality of anodes, and a pixel definition layer defining a plurality of subpixel apertures; wherein an orthographic projection of the plurality of touch electrode lines on the base substrate is completely non-overlapping with an orthographic projection of a light emitting material in the plurality of subpixel apertures on the base substrate.

Optionally, an orthographic projection of each data line of the plurality of data lines on the base substrate at least partially overlaps with an orthographic projection of a column of anodes of the plurality of anodes on the base substrate.

Optionally, an orthographic projection of each data line of the plurality of data lines on the base substrate at least partially overlaps with an orthographic projection of a light emitting material in a column of subpixel apertures of the plurality of subpixel apertures on the base substrate.

Optionally, the array substrate further comprises a plurality of first reset signal lines and a plurality of second reset signal lines in a layer on a side of the plurality of data lines closer to the base substrate; wherein the plurality of constant voltage signal lines comprise a plurality of third reset signal lines; wherein the array substrate comprises an interconnected reset signal network comprising the plurality of first reset signal lines, the plurality of second reset signal lines, and the plurality of third reset signal lines interconnected together; the plurality of first reset signal lines and the plurality of second reset signal lines extend along a direction substantially parallel to the first direction, respectively; the plurality of third reset signal lines extend along a direction substantially parallel to the second direction; a respective first reset signal line is connected to one or more third reset signal lines of the plurality of third reset signal lines; a respective second reset signal line is connected to one or more third reset signal lines of the plurality of third reset signal lines; and a respective third reset signal line of the plurality of third reset signal lines is connected to one or more first reset signal lines of the plurality of first reset signal lines and connected to one or more second reset signal lines of the plurality of second reset signal lines.

Optionally, the plurality of first reset signal lines and the plurality of second reset signal lines are in a semiconductor material layer comprising active layers of one or more transistors of a pixel driving circuit; and the plurality of third reset signal lines are in a second signal line layer on a side of the semiconductor material layer away from the base substrate.

Optionally, touch electrode lines in a same touch electrode block remain interconnected despite having the plurality of line breaks; and portions of discontinued electrode fragments in the respective first touch electrode line are electrically connected together by adjacent second touch electrode lines and one or more adjacent first touch electrode lines.

In another aspect, the present disclosure provides a display apparatus, comprising the array substrate described herein, and one or more integrated circuits connected to the array substrate.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The present disclosure provides, inter alia, an array substrate and a display apparatus that substantially obviate one or more of the problems due to limitations and disadvantages of the related art. In one aspect, the present disclosure provides an array substrate. In some embodiments, the array substrate includes a plurality of data lines; and a touch electrode layer comprising a plurality of touch electrode lines on a side of the plurality of data lines away from a base substrate. Optionally, the plurality of touch electrode lines include a plurality of first touch electrode lines extending along a direction substantially parallel to a first direction and a plurality of second touch electrode lines extending along a direction substantially parallel to a second direction. Optionally, the plurality of data lines extend along a direction substantially parallel to the second direction. Optionally, the array substrate comprises a plurality of line breaks where electrode lines of the plurality of first touch electrode lines discontinue. Optionally, an orthographic projection of an insulating material in a respective line break of the plurality of line breaks on the base substrate overlaps with an orthographic projection of an individual data line of the plurality of data lines on the base substrate. Optionally, where a line break of the plurality of line breaks is present, an orthographic projection of a respective first touch electrode line of the plurality of first touch electrode lines on the base substrate is non-overlapping with the orthographic projection of the individual data line on the base substrate.

Various appropriate pixel driving circuits may be used in the present array substrate. Examples of appropriate driving circuits include 3T1C, 2T1C, 4T1C, 4T2C, 5T2C, 6T1C, 7T1C, 7T2C, 8T1C, and 8T2C. In some embodiments, the respective one of the plurality of pixel driving circuits is a 7T1C driving circuit. Various appropriate light emitting elements may be used in the present array substrate. Examples of appropriate light emitting elements include organic light emitting diodes, quantum dots light emitting diodes, and micro light emitting diodes. Optionally, the light emitting element is micro light emitting diode. Optionally, the light emitting element is an organic light emitting diode including an organic light emitting layer.

Figure 1:
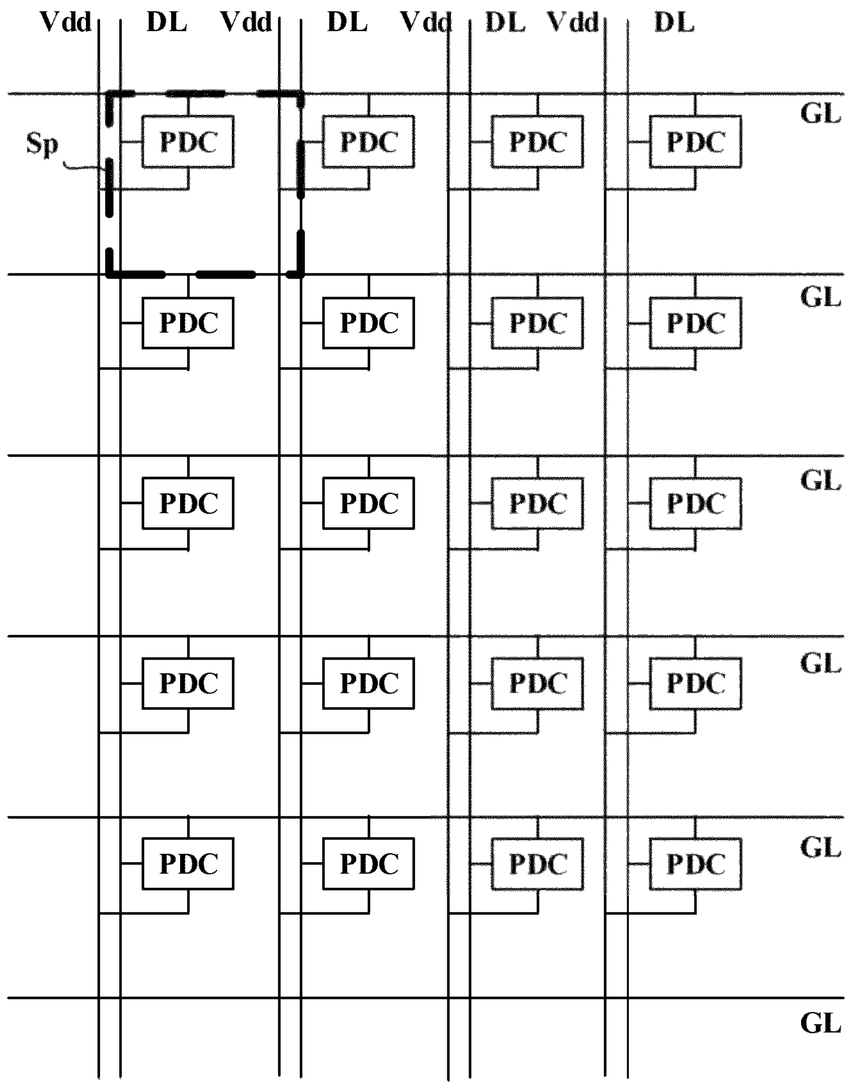
FIG. 1 is a plan view of an array substrate in some embodiments according to the present disclosure.

FIG. 1 is a plan view of an array substrate in some embodiments according to the present disclosure. Referring to FIG. 1, the array substrate includes an array of subpixels Sp. Each subpixel includes an electronic component, e.g., a light emitting element. In one example, the light emitting element is driven by a respective pixel driving circuit PDC. The array substrate includes a plurality of gate lines GL, a plurality of data lines DL, a plurality of voltage supply line Vdd. Light emission in a respective subpixel Sp is driven by a respective pixel driving circuit PDC. In one example, a high voltage signal (e.g., a VDD signal) is input, through the respective voltage supply line of the plurality of voltage supply line Vdd, to the respective pixel driving circuit PDC connected to an anode of the light emitting element, a low voltage signal (e.g., a VSS signal) is input, through a low voltage supply line, to a cathode of the light emitting element. A voltage difference between the high voltage signal (e.g., the VDD signal) and the low voltage signal (e.g., the VSS signal) is a driving voltage $\Delta V$ that drives light emission in the light emitting element.

Figure 2A:
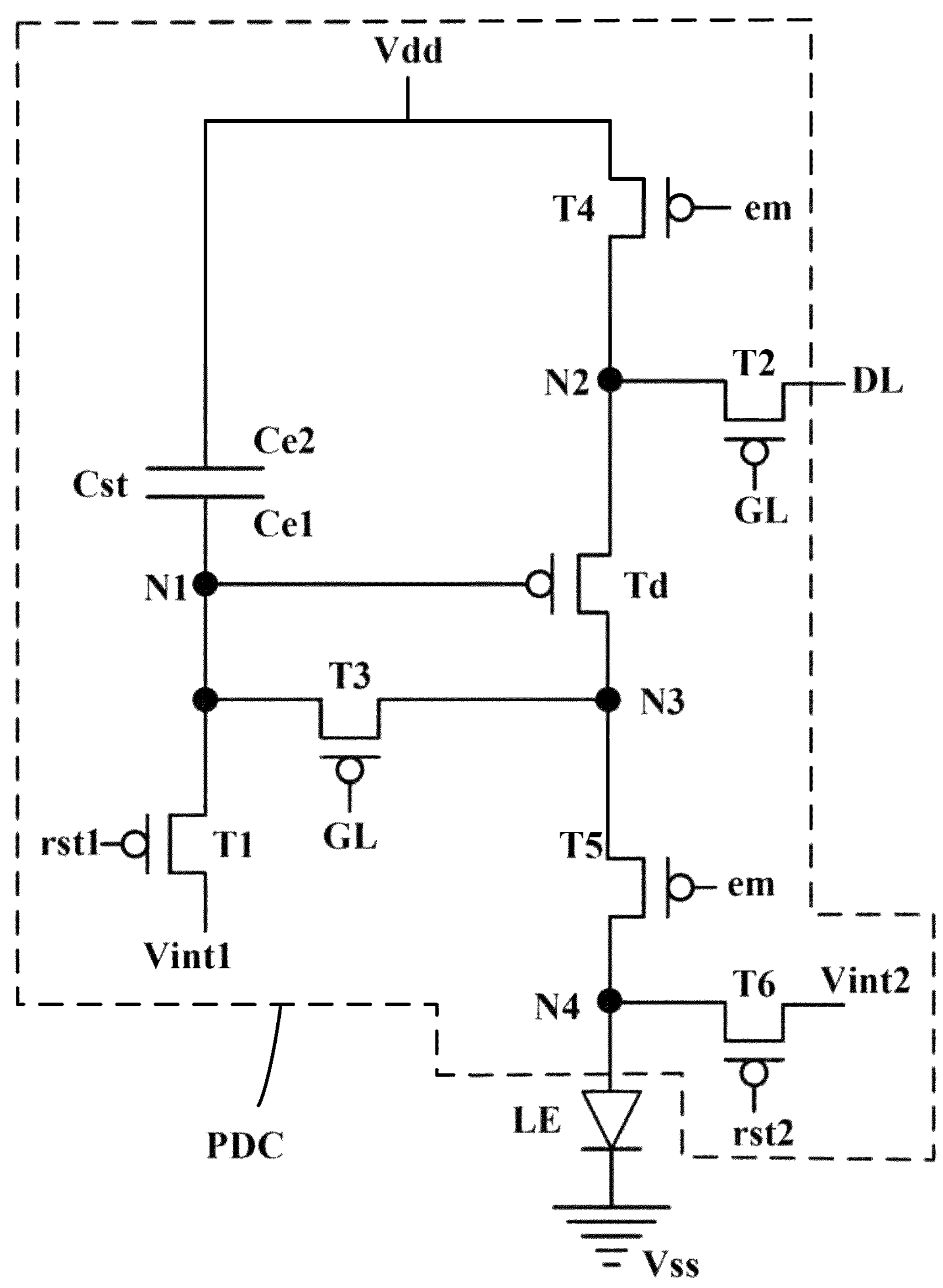
FIG. 2A is a circuit diagram illustrating the structure of a pixel driving circuit in some embodiments according to the present disclosure.

FIG. 2A is a circuit diagram illustrating the structure of a pixel driving circuit in some embodiments according to the present disclosure. Referring to FIG. 2A, in some embodiments, the pixel driving circuit includes a driving transistor Td; a storage capacitor Cst having a first capacitor electrode Ce1 and a second capacitor electrode Ce2; a first transistor T1 having a gate electrode connected to a respective first reset control signal line of a plurality of first reset control signal lines rst1, a first electrode connected to a respective first reset signal line of a plurality of first reset signal lines Vint1, and a second electrode connected to a first capacitor electrode Ce1 of the storage capacitor Cst and a gate electrode of the driving transistor Td; a second transistor T2 having a gate electrode connected to a respective gate line of a plurality of gate lines GL, a first electrode connected to a respective data line of a plurality of data lines DL, and a second electrode connected to a first electrode of the driving transistor Td; a third transistor T3 having a gate electrode connected to the respective gate line, a first electrode connected to a second electrode of the driving transistor Td, and a second electrode connected to the first capacitor electrode Ce1 of the storage capacitor Cst and the gate electrode of the driving transistor Td; a fourth transistor T4 having a gate electrode connected to a respective light emitting control signal line of a plurality of light emitting control signal lines em, a first electrode connected to a respective voltage supply line of a plurality of voltage supply lines Vdd, and a second electrode connected to the first electrode of the driving transistor Td and the second electrode of the second transistor T2; a fifth transistor T5 having a gate electrode connected to the respective light emitting control signal line, a first electrode connected to second electrodes of the driving transistor Td and the third transistor T3, and a second electrode connected to an anode of a light emitting element LE; and a sixth transistor T6 having a gate electrode connected to a respective second reset control signal line of a plurality of second reset control signal lines rst2, a first electrode connected to a second reset signal line of a plurality of second reset signal lines Vint2, and a second electrode connected to the second electrode of the fifth transistor and the anode of the light emitting element LE, The second capacitor electrode Ce2 is connected to the respective voltage supply line and the first electrode of the fourth transistor T4.

In some embodiments, the pixel driving circuit includes a driving transistor Td, a data write transistor (e.g., the second transistor T2), a compensating transistor (e.g., the third transistor T3), two light emitting control transistors (e.g., the fourth transistor T4 and the fifth transistor T5), and two reset transistors (e.g., the first transistor T1 and the sixth transistor T6).

Figure 2B:
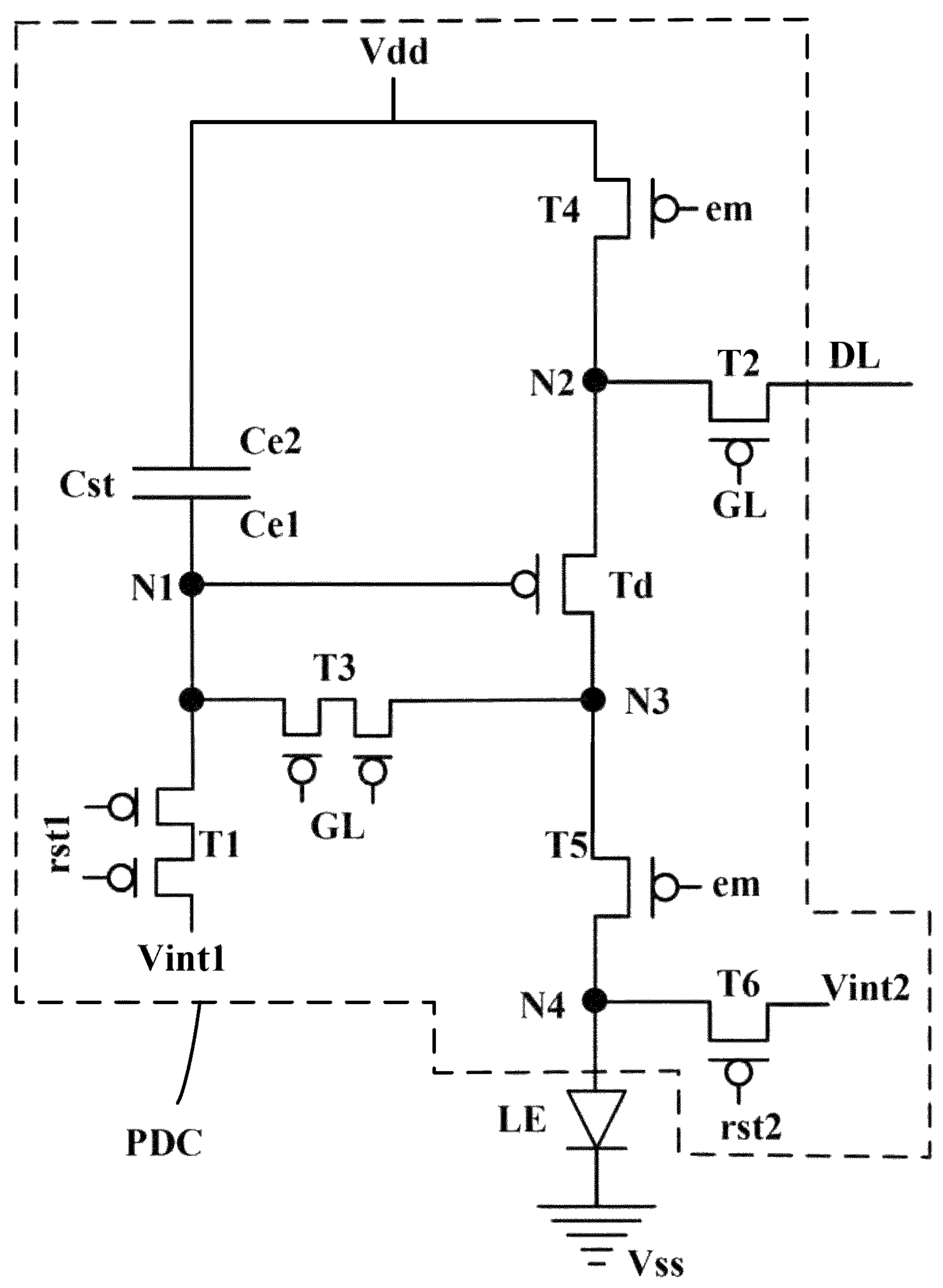
FIG. 2B is a circuit diagram illustrating the structure of a pixel driving circuit in some embodiments according to the present disclosure.

FIG. 2B is a circuit diagram illustrating the structure of a pixel driving circuit in some embodiments according to the present disclosure. Referring to FIG. 2B, in some embodiments, the third transistor T3 is a "double gate" transistor, and the first transistor T1 is a "double gate" transistor. Optionally, in a "double gate" first transistor, the active layer of the first transistor crosses over a respective reset control signal lines twice (alternatively, the respective reset control signal line crosses over the active layer of the first transistor T1 twice). Similarly, in a "double gate" third transistor, the active layer of the third transistor T3 crosses over a respective first gate line of the plurality of first gate lines GL1 twice (alternatively, the respective gate line crosses over the active layer of the third transistor T3 twice). The gate electrode of the first transistor T1 is denoted as "G1" in FIG. 3D, in which the first transistor T1 is a "double gate" transistor. The gate electrode of the third transistor T3 is denoted as "G3" in FIG. 3D, in which the third transistor T3 is a "double gate" transistor.

The pixel driving circuit further include a first node N1, a second node N2, a third node N3, and a fourth node N4. The first node N1 is connected to the gate electrode of the driving transistor Td, the first capacitor electrode Ce1, and the second electrode of the third transistor T3. The second node N2 is connected to the second electrode of the fourth transistor T4, the second electrode of the second transistor T2, and the first electrode of the driving transistor Td. The third node N3 is connected to the second electrode of the driving transistor Td, the first electrode of the third transistor T3, and the first electrode of the fifth transistor T5. The fourth node N4 is connected to the second electrode of the fifth transistor T5, the second electrode of the sixth transistor T6, and the anode of the light emitting element LE.

As used herein, a first electrode or a second electrode refers to one of a first terminal and a second terminal of a transistor, the first terminal and the second terminal being connected to an active layer of the transistor. A direction of a current flowing through the transistor may be configured to be from a first electrode to a second electrode, or from a second electrode to a first electrode. Accordingly, depending on the direction of the current flowing through the transistor, in one example, the first electrode is configured to receive an input signal and the second electrode is configured to output an output signal; in another example, the second electrode is configured to receive an input signal and the first electrode is configured to output an output signal.

Figure 2C:
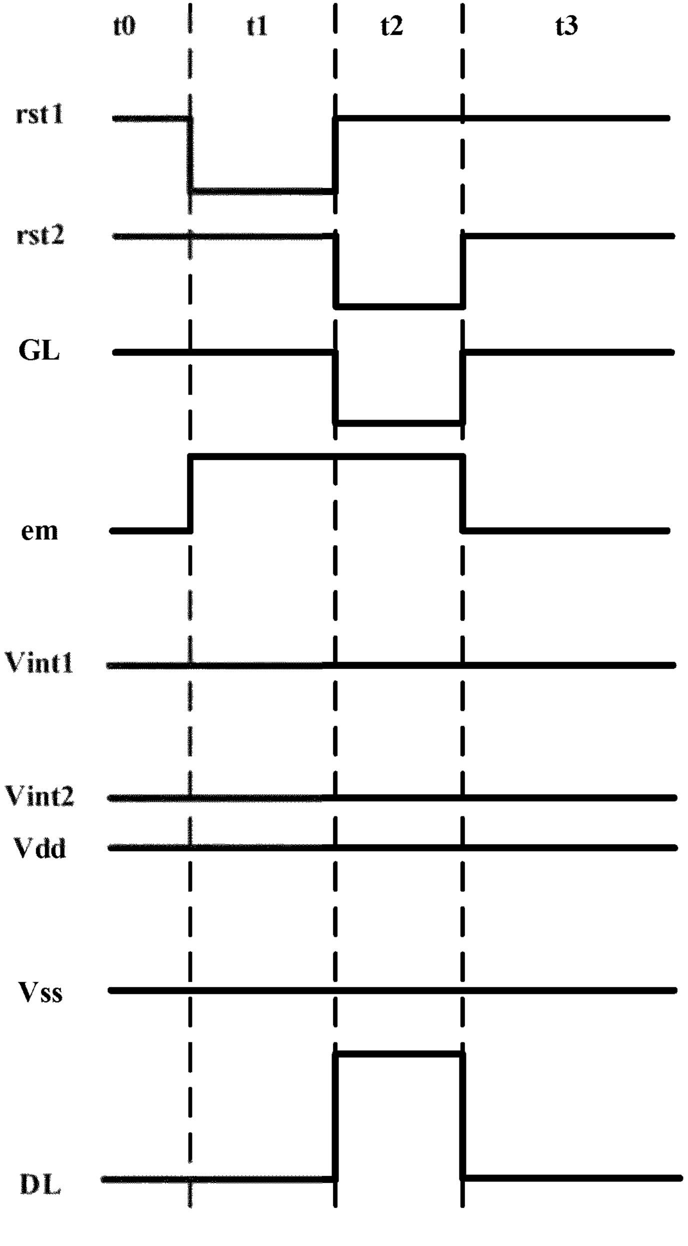
FIG. 2C is a timing diagram illustrating the operation of a pixel driving circuit in some embodiments according to the present disclosure.

FIG. 2C is a timing diagram illustrating the operation of a pixel driving circuit in some embodiments according to the present disclosure, Referring to FIG. 2A to FIG. 2C, during one frame of image, the operation of the pixel driving circuit includes a reset sub-phase t1, a data write sub-phase t2, and a light emitting sub-phase 13. In the initial sub-phase 10, a turning-off reset control signal is provided through the respective first reset control signal line of the plurality of first reset control signal lines rst1 to the gate electrode of the first transistor T1 to turn off the first transistor T1, a turning-off reset control signal is provided through the respective second reset control signal line of the plurality of second reset control signal lines rst2 to the gate electrode of the sixth transistor T6 to turn off the sixth transistor T6. In the initial sub-phase 10, the respective gate line of the plurality of gate lines GL is provided with a turning-off signal, thus the second transistor T2 and the third transistor T3 are turned off.

In the reset sub-phase t1, a turning-on reset control signal is provided through the respective first reset control signal line of the plurality of first reset control signal lines rst1 to the gate electrode of the first transistor T1 to turn on the first transistor T1; allowing an initialization voltage signal from the respective first reset signal line of the plurality of first reset signal lines Vint1 to pass from a first electrode of the first transistor T1 to a second electrode of the first transistor T1, and in turn to the first capacitor electrode Ce1 and the gate electrode of the driving transistor Td. The gate electrode of the driving transistor Td is initialized. The second capacitor electrode Ce2 receives a high voltage signal from the respective voltage supply line of the plurality of voltage supply lines Vdd. The first capacitor electrode Ce1 is charged in the reset sub-phase t1 due to an increasing voltage difference between the first capacitor electrode Ce1 and the second capacitor electrode Ce2. In the reset sub-phase t1, the respective gate line of the plurality of gate lines GL is provided with a turning-off signal, thus the second transistor T2 and the third transistor T3 are turned off. The respective light emitting control signal line of the plurality of light emitting control signal lines em is provided with a high voltage signal to turn off the fourth transistor T4 and the fifth transistor T5.

In the data write sub-phase (2, the turning-off reset control signal is again provided through the respective first reset control signal line of the plurality of first reset control signal lines rst1 to the gate electrode of the first transistor T1 to turn off the first transistor T1. The respective gate line of the plurality of gate lines GL is provided with a turning-on signal, thus the second transistor T2 and the third transistor T3 are turned on. A second electrode of the driving transistor Td is connected with the first electrode of the third transistor T3. A gate electrode of the driving transistor Td is electrically connected with the second electrode of the third transistor T3. Because the third transistor T3 is turned on in the data write sub-phase t2, the gate electrode and the second electrode of the driving transistor Td are connected and short circuited, and only the PN junction between the gate electrode and a first electrode of the driving transistor Td is effective, thus rendering the driving transistor Td in a diode connecting mode. The second transistor T2 is turned on in the data write sub-phase t2. The data voltage signal transmitted through the respective data line of a plurality of data lines DL is received by a first electrode of the second transistor T2, and in turn transmitted to the first electrode of the driving transistor Td, which is connected to the second electrode of the second transistor T2. A node N2 connecting to the first electrode of the driving transistor Td has a voltage level of the data voltage signal. Because only the PN junction between the gate electrode and a first electrode of the driving transistor Td is effective, the voltage level at the node N1 in the data write sub-phase t2 increase gradually to (Vdata+Vth), wherein the Vdata is the voltage level, of the data voltage signal, and the Vth is the voltage level of the threshold voltage Th of the PN junction. The storage capacitor Cst is discharged because the voltage difference between the first capacitor electrode Ce1 and the second capacitor electrode Ce2 is reduced to a relatively small value. The respective light emitting control signal line of the plurality of light emitting control signal lines em is provided with a high voltage signal to turn off the fourth transistor T4 and the fifth transistor T5.

In the data write sub-phase t2, a turning-on reset control signal is provided through the respective second reset control signal line of the plurality of second reset control signal lines rst2 to the gate electrode of the sixth transistor T6 to turn on the sixth transistor T6; allowing an initialization voltage signal from the respective second reset signal line of the plurality of second reset signal lines Vint2 to pass from a first electrode of the sixth transistor T6 to a second electrode of the sixth transistor T6; and in turn to the node N4. The anode of the light emitting element LE is initialized.

In the light emitting sub-phase t3, the turning-off reset control signal is again provided through the respective first reset control signal line of the plurality of first reset control signal lines rst1 to the gate electrode of the first transistor T1 to turn off the first transistor T1. The respective gate line of the plurality of gate lines GL is provided with a turning-off signal, the second transistor T2 and the third transistor T3 are turned off. The respective light emitting control signal line of the plurality of light emitting control signal lines em is provided with a low voltage signal to turn on the fourth transistor T4 and the fifth transistor T5. The voltage level at the node N1 in the light emitting sub-phase 13 is maintained at (Vdata+Vth), the driving transistor Td is turned on by the voltage level, and working in the saturation area. A path is formed through the fourth transistor T4, the driving transistor Td, the fifth transistor T5, to the light emitting element LE. The driving transistor Td generates a driving current for driving the light emitting element LE to emit light. A voltage level at a node N3 connected to the second electrode of the driving transistor Td equals to a light emitting voltage of the light emitting element LE.

The array substrate in some embodiments includes a plurality of subpixels. In some embodiments, the plurality of subpixels includes a respective first subpixel, a respective second subpixel, and a respective third subpixel. Optionally, a respective pixel of the array substrate includes the respective first subpixel, the respective second subpixel, and the respective third subpixel. The plurality of subpixels in the array substrate are arranged in an array. In one example, the array of the plurality of subpixels includes a S1-S2-S3 format repeating array, in which S1 stands for the respective first subpixel, S2 stands for the respective second subpixel, and S3 stands for the respective third subpixel. In another example, the S1-S2-S3 format is a C1-C2-C3 format, in which C1 stands for the respective first subpixel of a first color, C2 stands for the respective second subpixel of a second color, and C3 stands for the respective third subpixel of a third color. In another example, the C1-C2-C3 format is an R-G-B format, in which the respective first subpixel is a red subpixel, the respective second subpixel is a green subpixel, and the respective third subpixel is a blue subpixel.

In another example, the array of the plurality of subpixels includes a S1-S2-S3-S4 format repeating array, in which S1 stands for the respective first subpixel, S2 stands for the respective second subpixel, S3 stands for the respective third subpixel, and S4 stands for the respective fourth subpixel. In another example, the S1-S2-S3-S4 format is a C1-C2-C3-C4 format, in which C1 stands for the respective first subpixel of a first color, C2 stands for the respective second subpixel of a second color, C3 stands for the respective third subpixel of a third color, and C4 stands for the respective fourth subpixel of a fourth color. In another example, the S1-S2-S3-S4 format is a C1-C2-C3-C2' format, in which C1 stands for the respective first subpixel of a first color, C2 stands for the respective second subpixel of a second color, C3 stands for the respective third subpixel of a third color, and C2' stands for the respective fourth subpixel of the second color. In another example, the C1-C2-C3-C2' format is a R-G-B-G format, in which the respective first subpixel is a red subpixel, the respective second subpixel is a green subpixel, the respective third subpixel is a blue subpixel, and the respective fourth subpixel is a green subpixel.

In some embodiments, a minimum repeating unit of the plurality of subpixels of the array substrate includes a respective first subpixel, a respective second subpixel, and a respective third subpixel. Optionally, each of the respective first subpixel, the respective second subpixel, and the respective third subpixel, includes the first transistor T1, the second transistor T2, the third transistor T3, the fourth transistor T4, the fifth transistor T5, the sixth transistor T6, the driving transistor Td, and the storage capacitor Cst.

In alternative embodiments, a minimum repeating unit of the plurality of subpixels of the array substrate includes a respective first subpixel, a respective second subpixel, a respective third subpixel, and a respective fourth subpixel. Optionally, each of the respective first subpixel, the respective second subpixel, the respective third subpixel, and the respective fourth subpixel, includes the first transistor T1, the second transistor T2, the third transistor T3, the fourth transistor T4, the fifth transistor T5, the sixth transistor T6, the driving transistor Td, and the storage capacitor Cst.

Figure 3A:
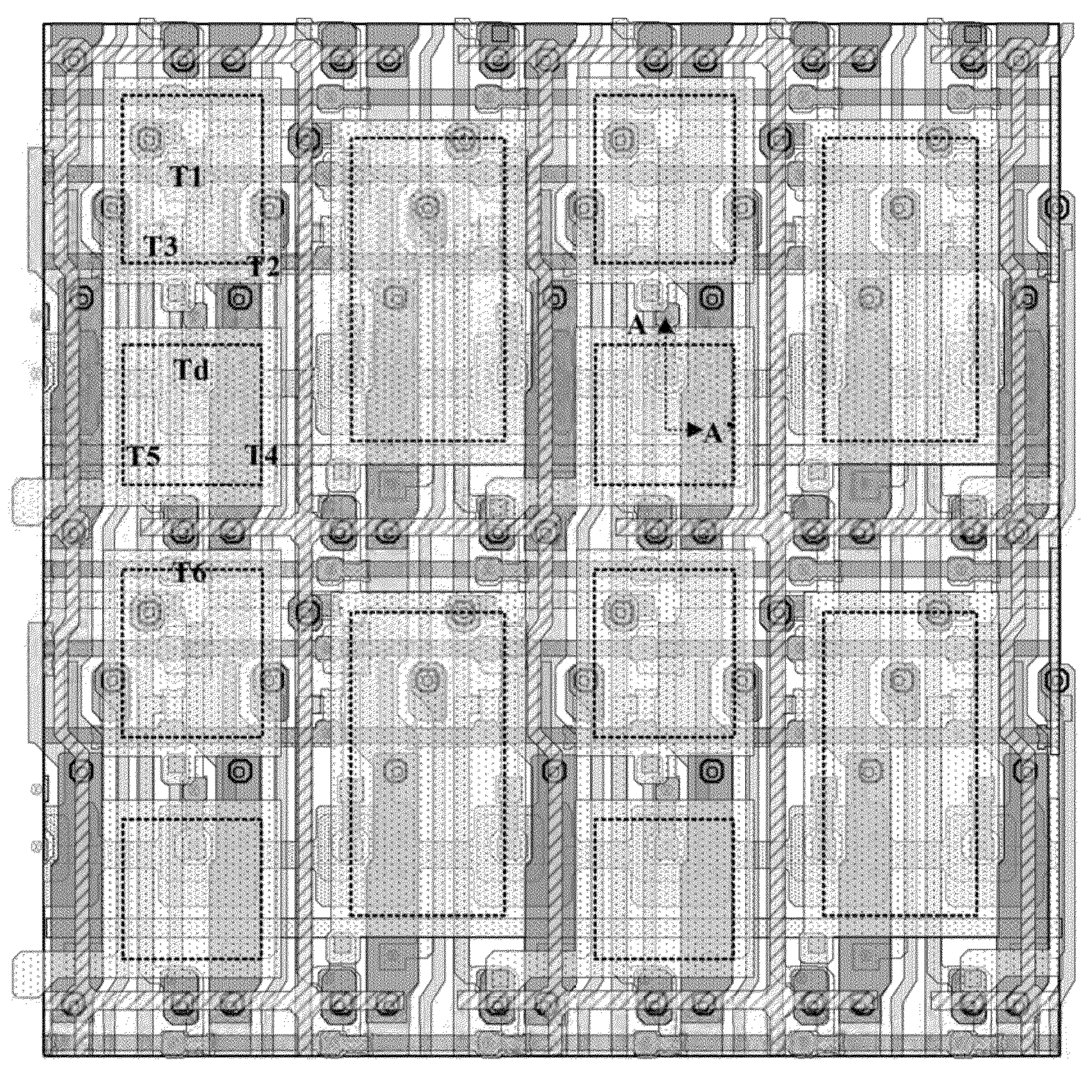
FIG. 3A is a diagram illustrating the structure of an array substrate in some embodiments according to the present disclosure.
Figure 3B:
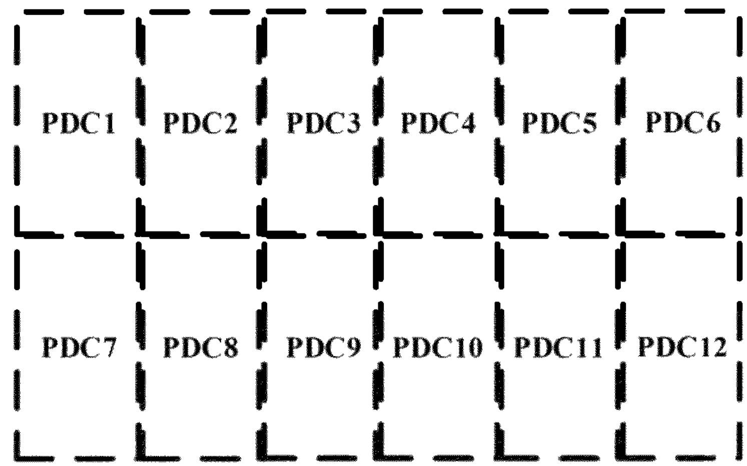
FIG. 3B is a schematic diagram illustrating an arrangement of a plurality of pixel driving circuits in an array substrate depicted in FIG. 3A.
Figure 3C:
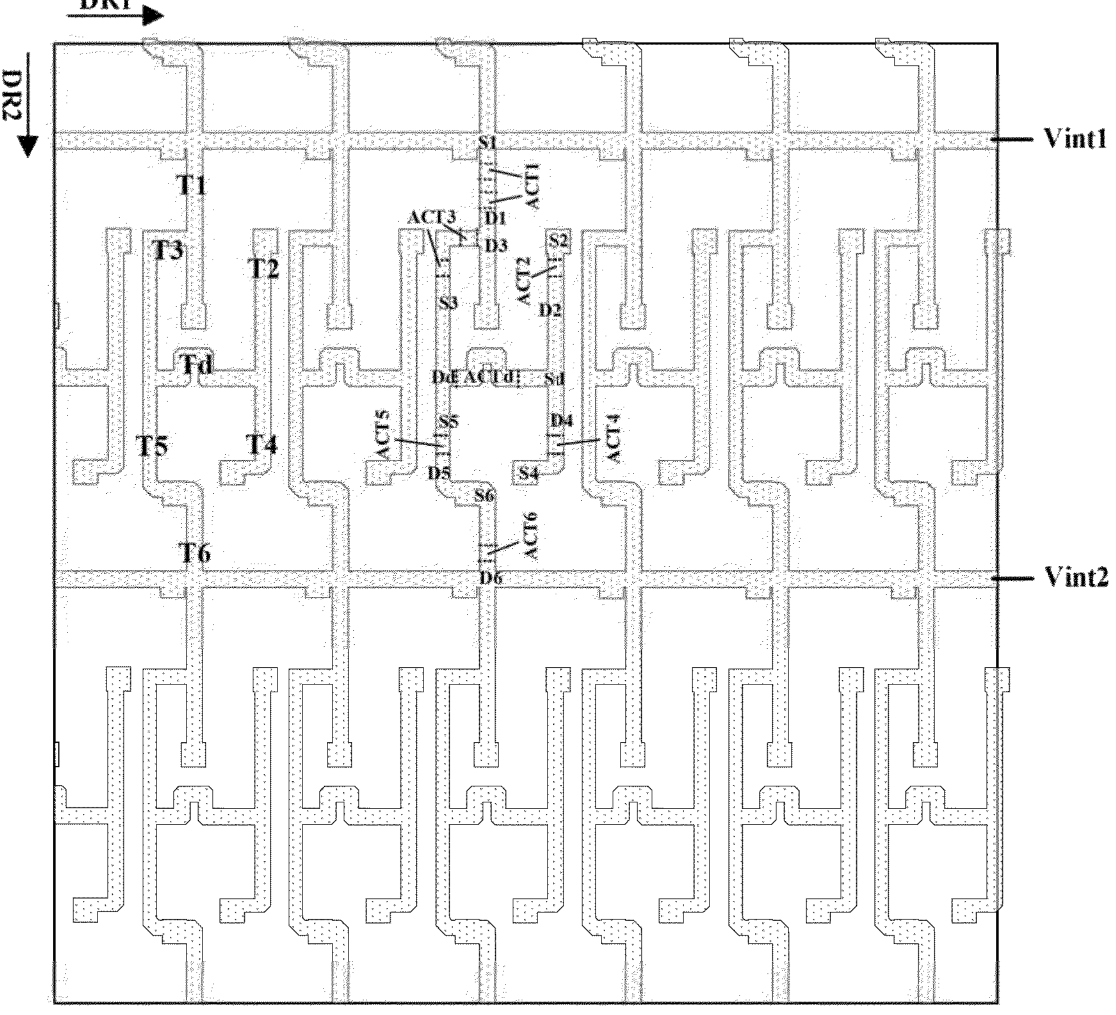
FIG. 3C is a diagram illustrating the structure of a semiconductor material layer in an array substrate depicted in FIG. 3A.
Figure 3D:
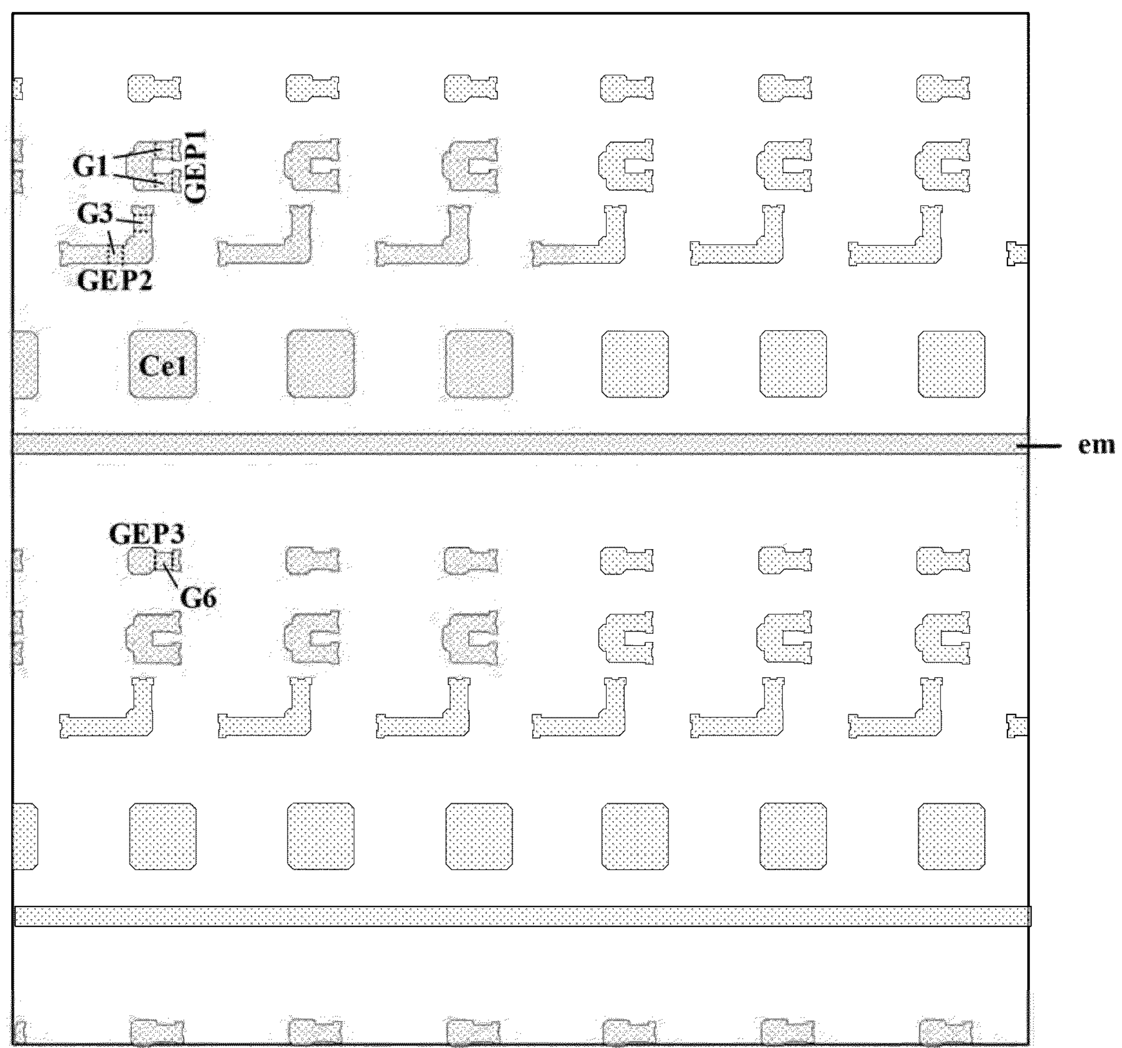
FIG. 3D is a diagram illustrating the structure of a first conductive layer in an array substrate depicted in FIG. 3A.
Figure 3E:
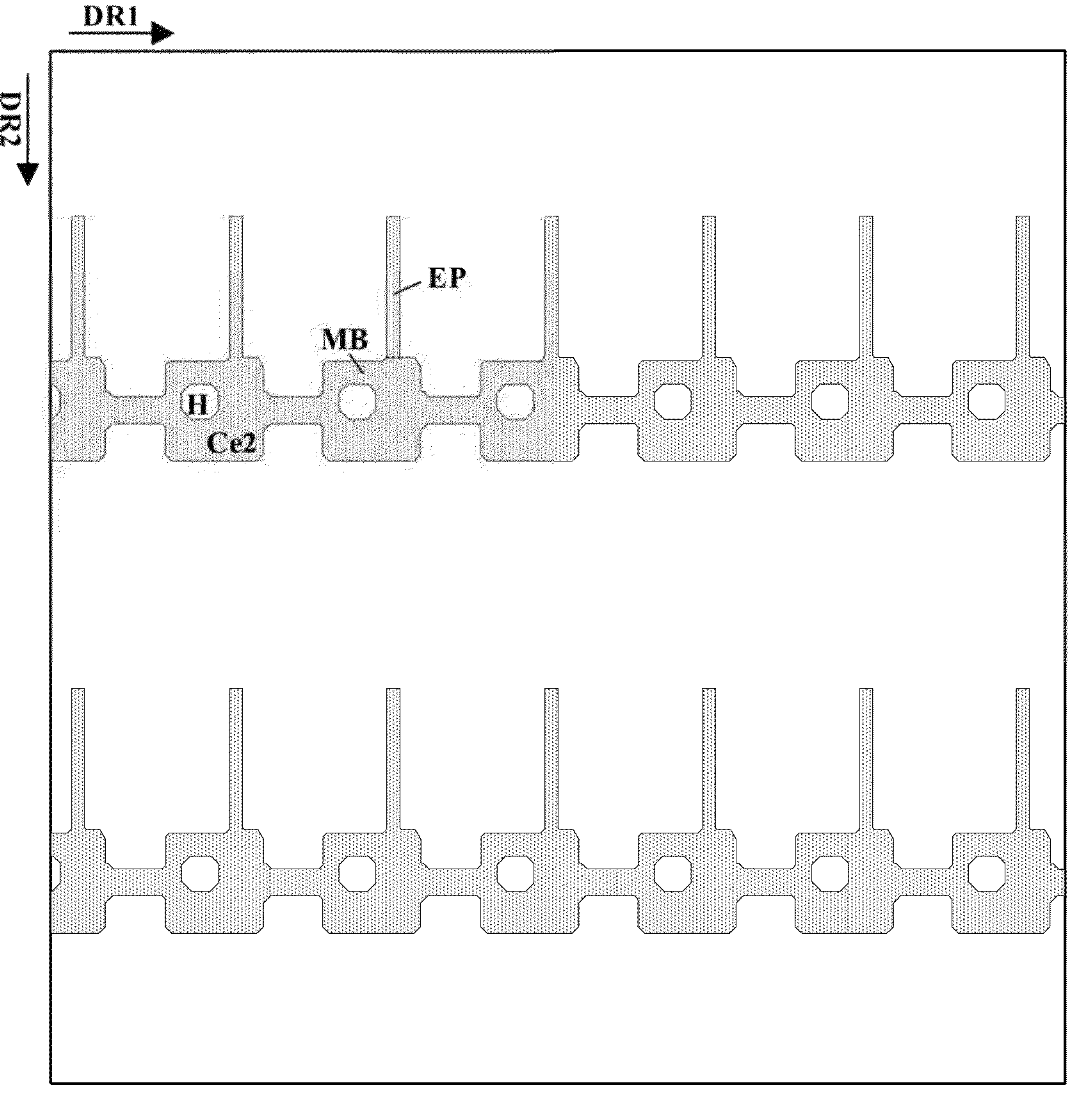
FIG. 3E is a diagram illustrating the structure of a second conductive layer in an array substrate depicted in FIG. 3A.
Figure 3F:
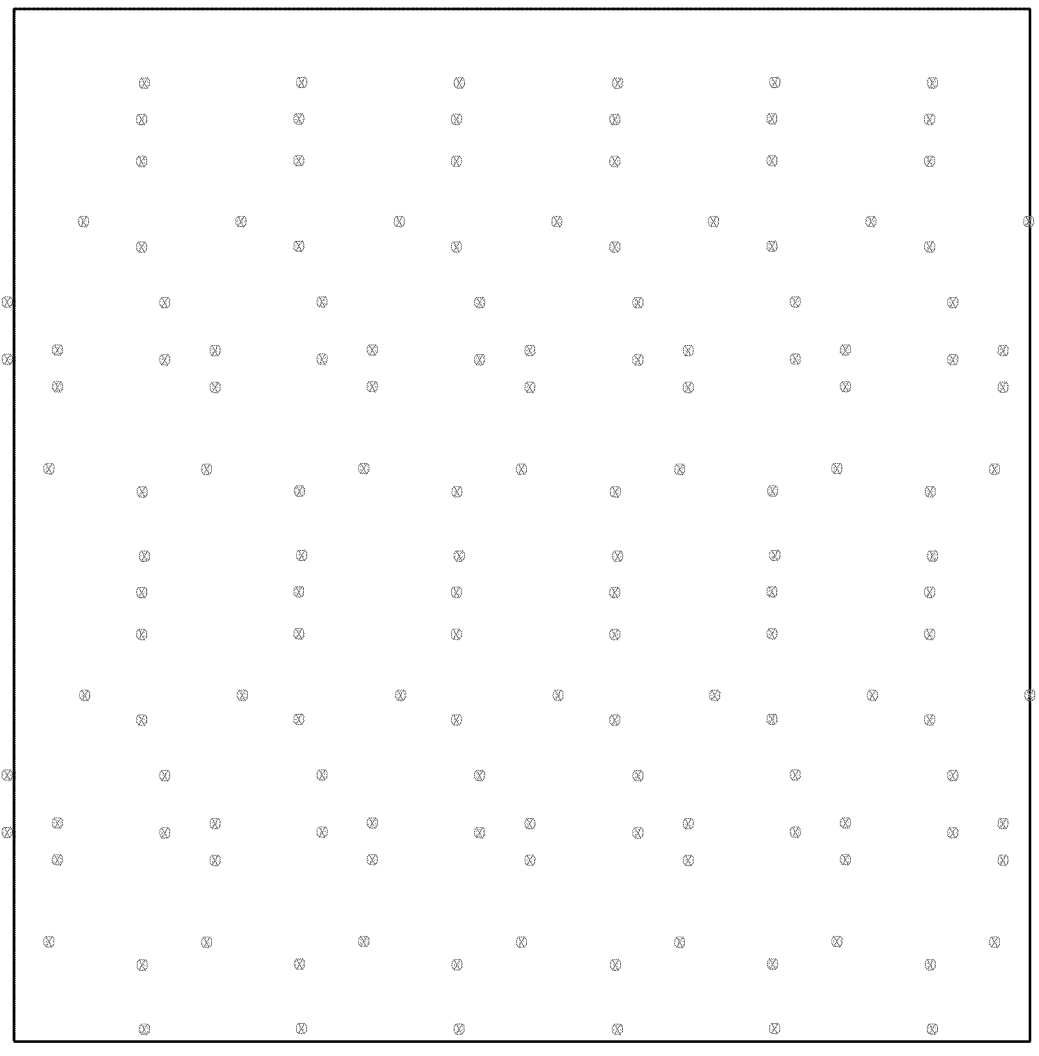
FIG. 3F is a diagram illustrating the structure of an inter-layer dielectric layer in an array substrate depicted in FIG. 3A.
Figure 3G:
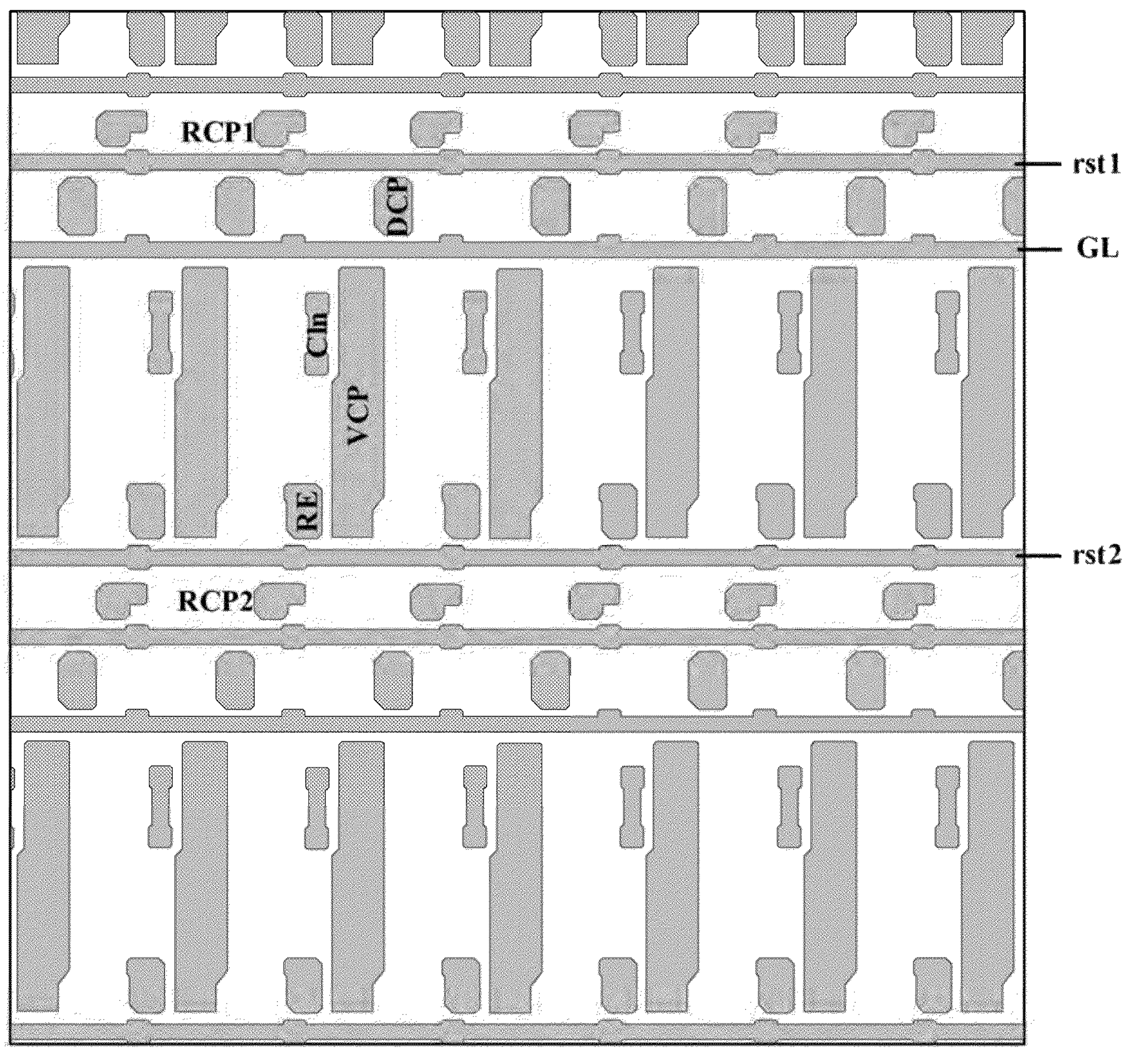
FIG. 3G is a diagram illustrating the structure of a first signal line layer in an array substrate depicted in FIG. 3A.
Figure 3H:
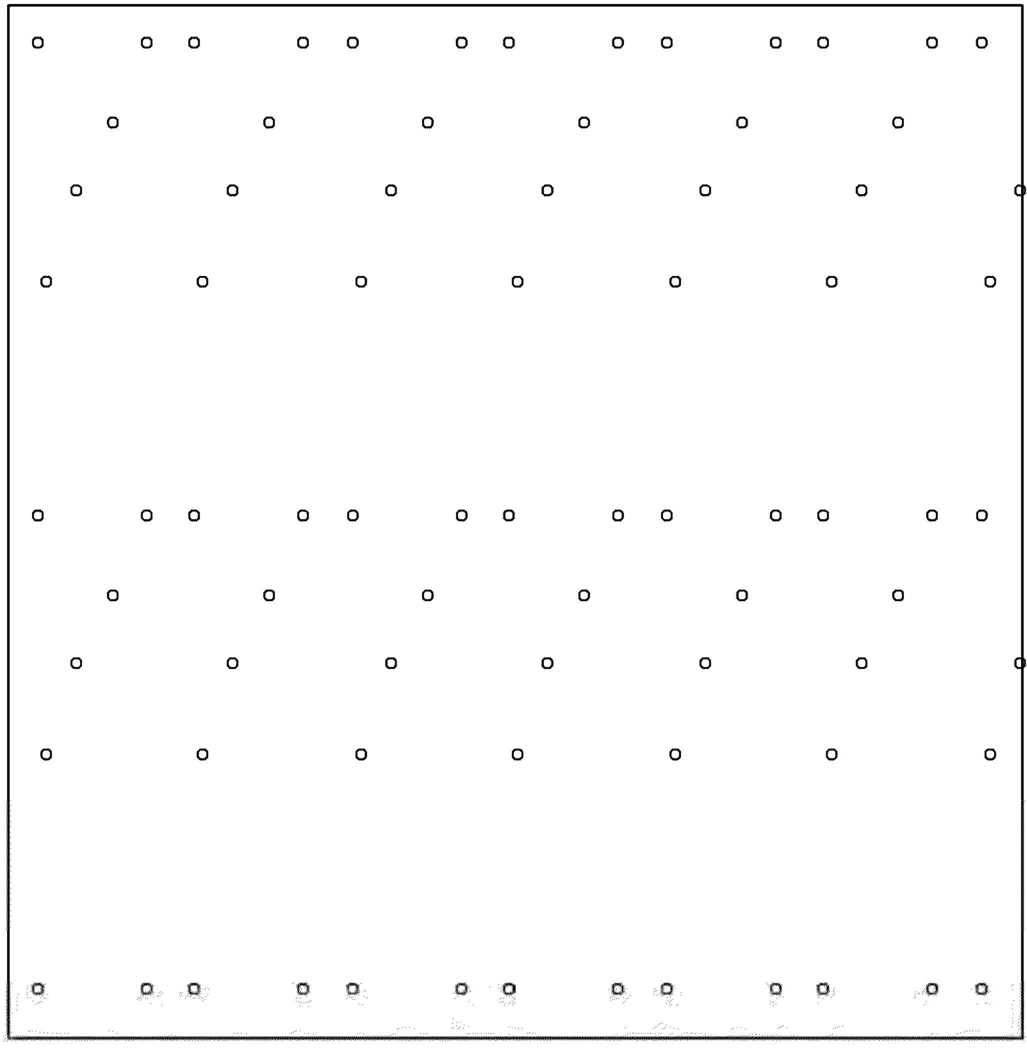
FIG. 3H is a diagram illustrating the structure of a passivation layer in an array substrate depicted in FIG. 3A.
Figure 3I:
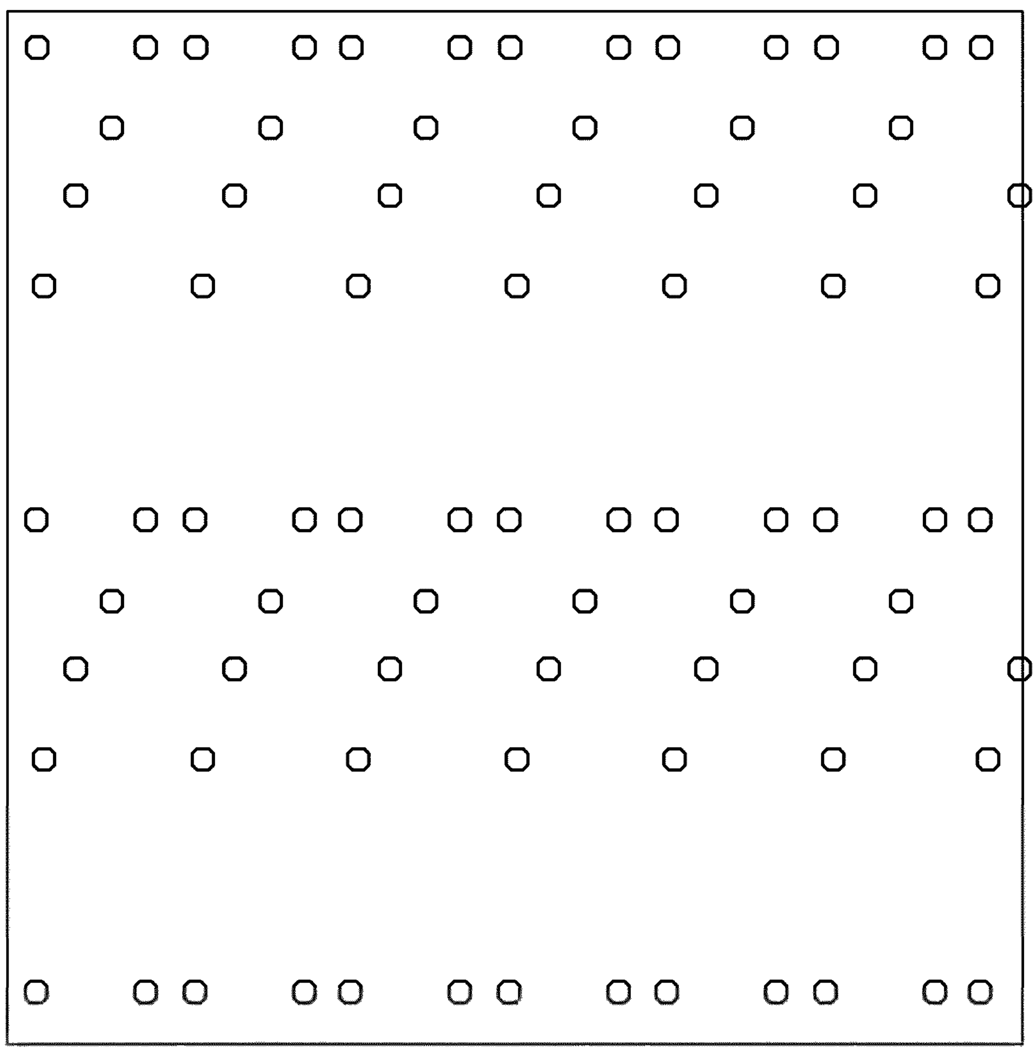
FIG. 3I is a diagram illustrating the structure of a first planarization layer in an array substrate depicted in FIG. 3A.
Figure 3J:
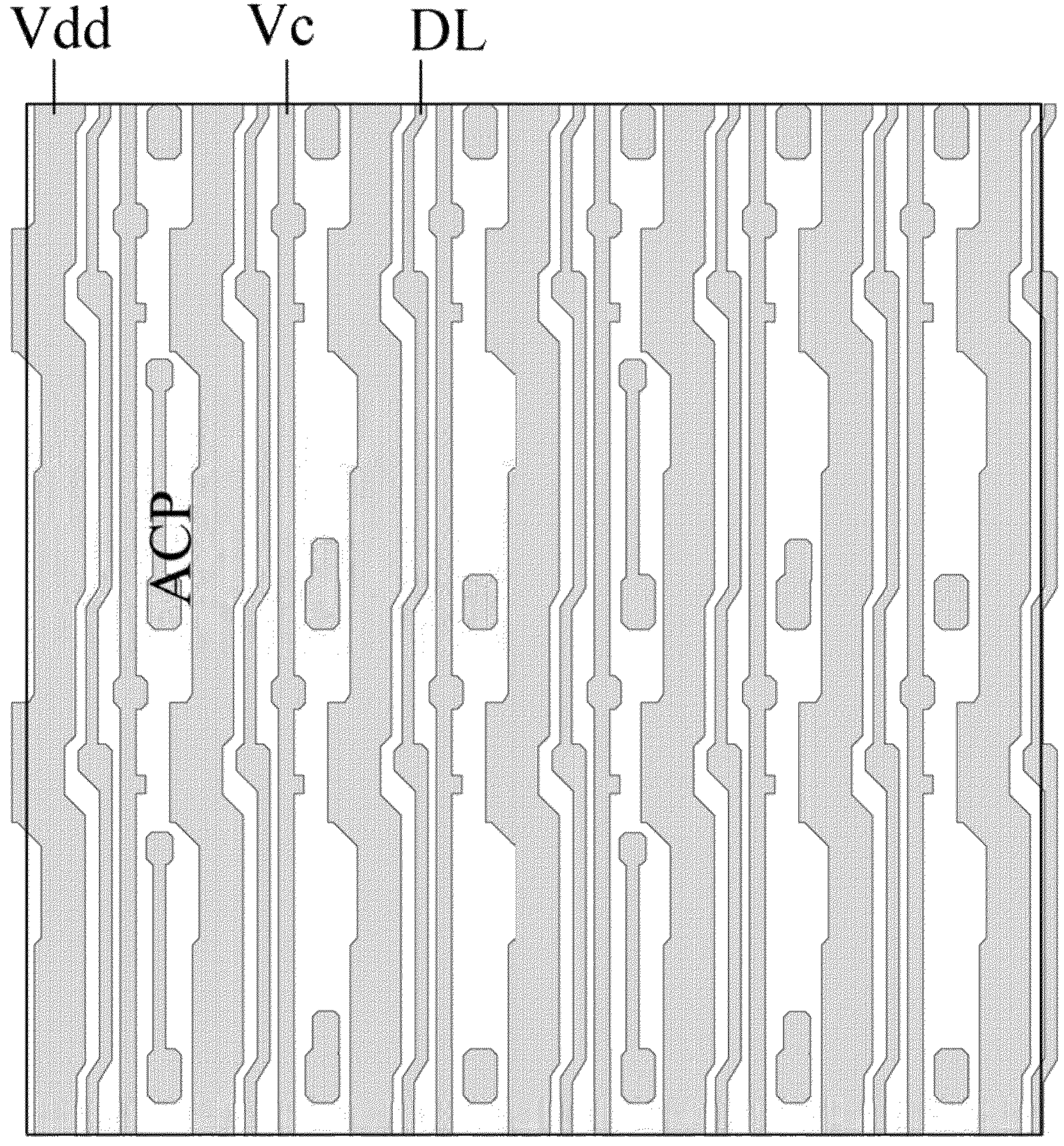
FIG. 3J is a diagram illustrating the structure of a second signal line layer in an array substrate depicted in FIG. 3A.
Figure 3K:
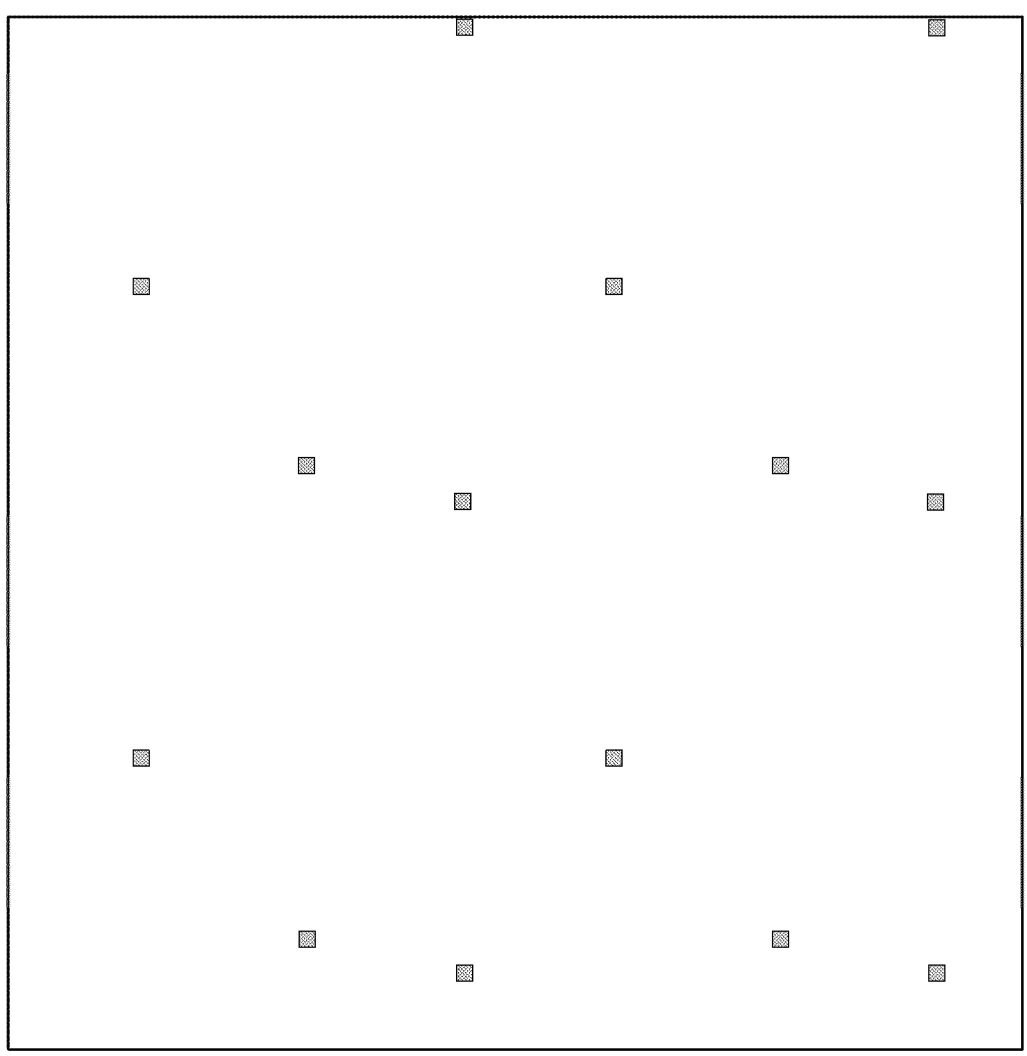
FIG. 3K is a diagram illustrating the structure of a second planarization layer in an array substrate depicted in FIG. 3A.
Figure 3L:
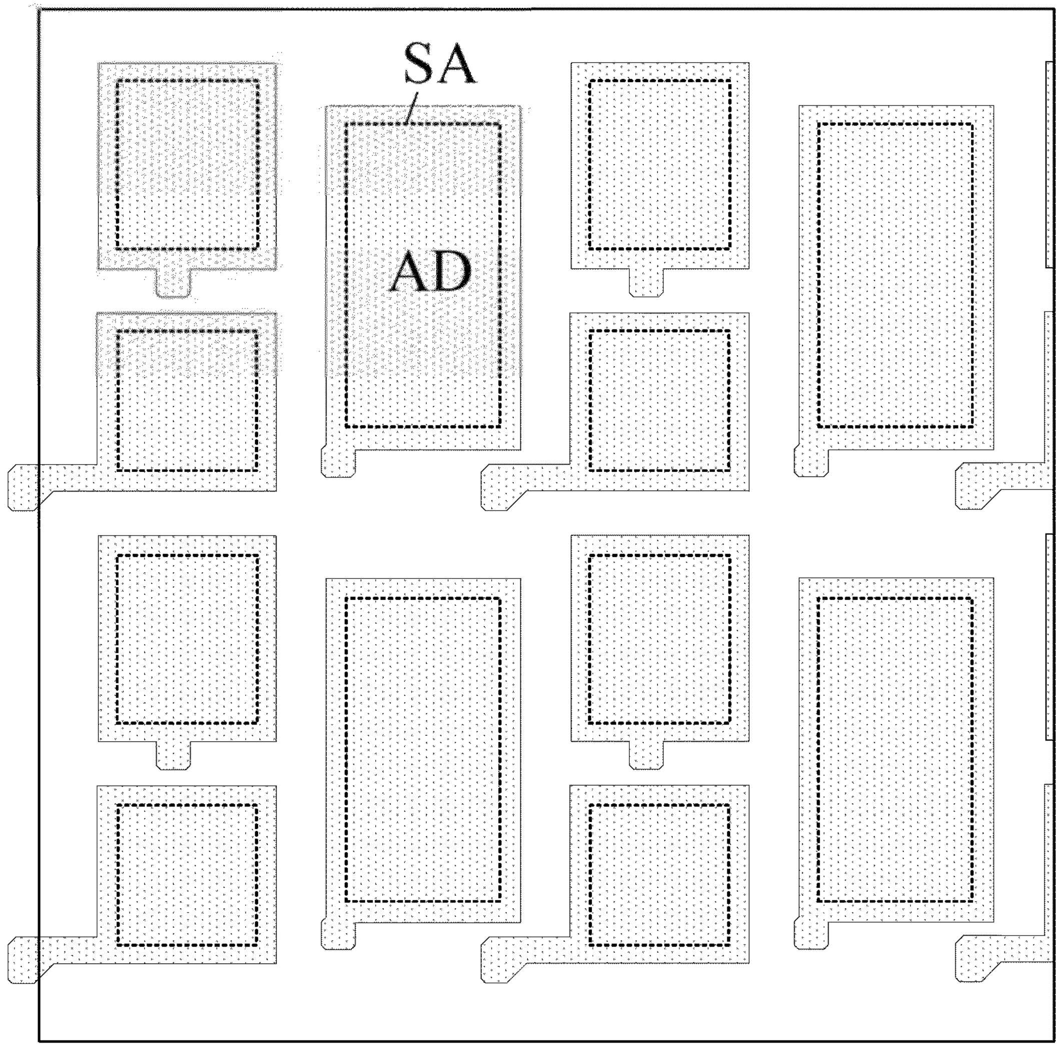
FIG. 3L is a diagram illustrating the structure of an anode layer in an array substrate depicted in FIG. 3A.
Figure 3M:
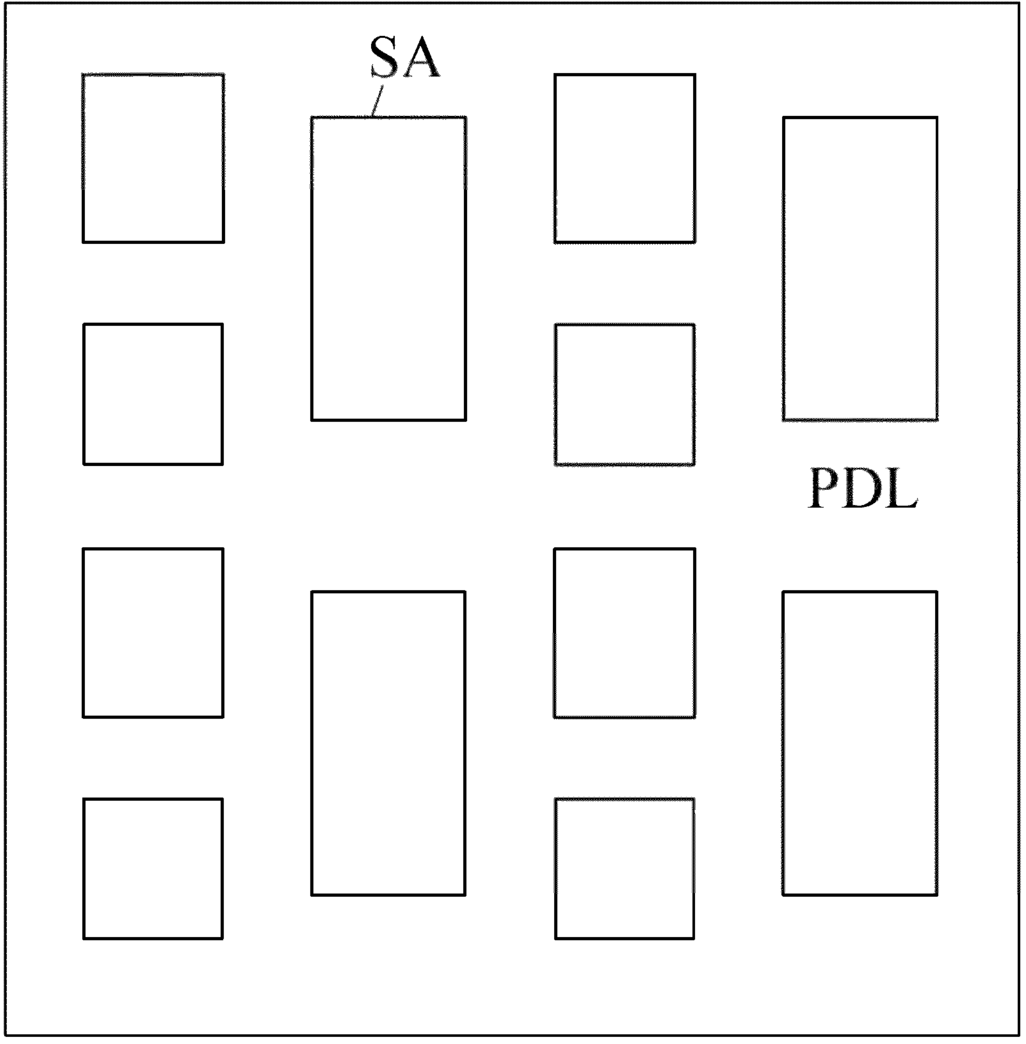
FIG. 3M is a diagram illustrating the structure of a pixel definition layer in an array substrate depicted in FIG. 3A.
Figure 3N:
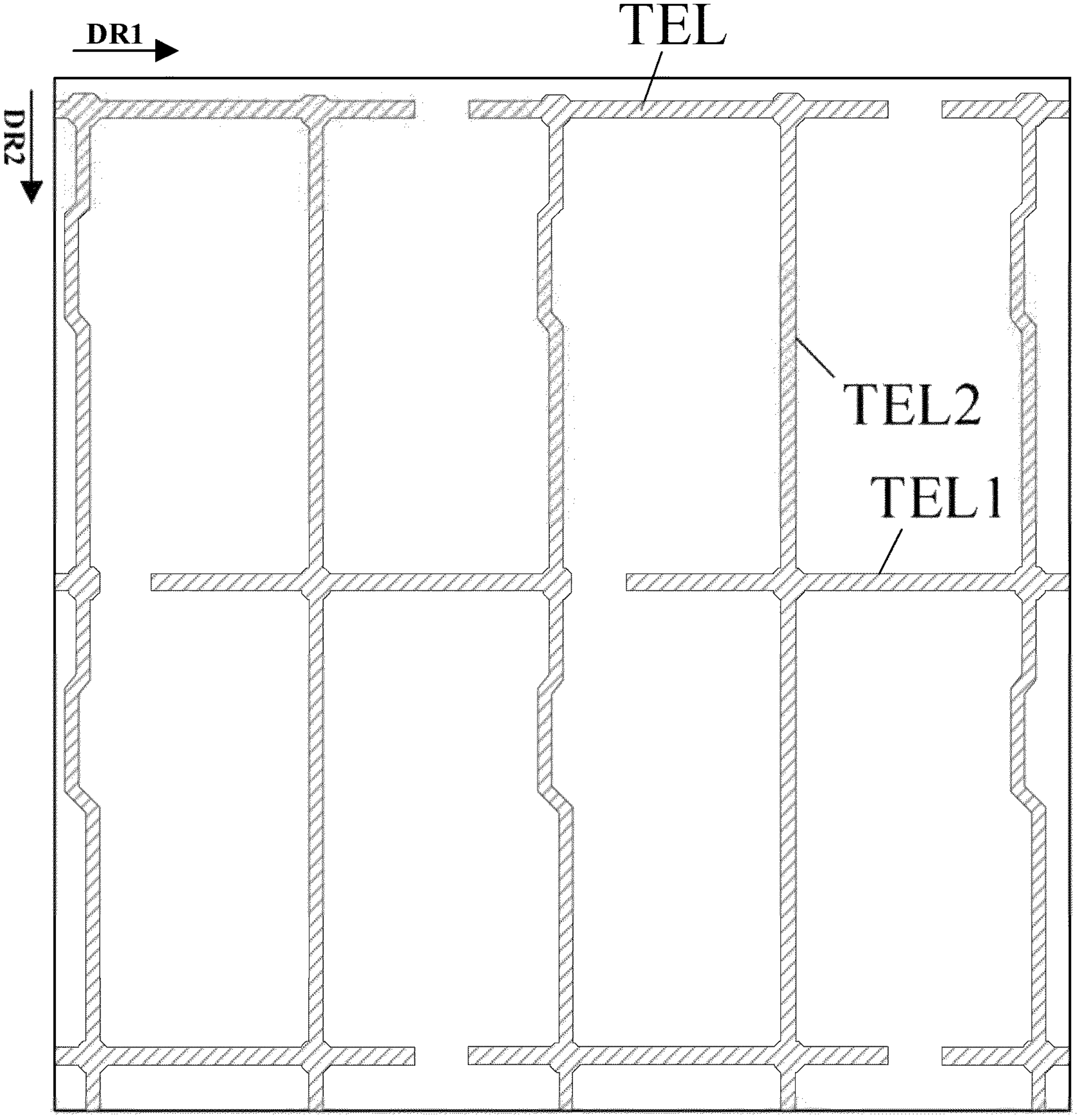
FIG. 3N is a diagram illustrating the structure of a touch electrode layer in an array substrate depicted in FIG. 3A.

FIG. 3A is a diagram illustrating the structure of an array substrate in some embodiments according to the present disclosure. FIG. 3B is a schematic diagram illustrating an arrangement of a plurality of pixel driving circuits in an array substrate depicted in FIG. 3A. FIG. 3A and FIG. 3B depicts a portion of the array substrate having twelve pixel driving circuits, including PDC1, PDC2, PDC3, PDC4, PDC5, PDC6, PDC7, PDC8, PDC9, PDC10, PDC11, and PDC12, FIG. 3C is a diagram illustrating the structure of a semiconductor material layer in an array substrate depicted in FIG. 3A. FIG. 3D is a diagram illustrating the structure of a first conductive layer in an array substrate depicted in FIG. 3A. FIG. 3B is a diagram illustrating the structure of a second conductive layer in an array substrate depicted in FIG. 3A. FIG. 3F is a diagram illustrating the structure of an inter-layer dielectric layer in an array substrate depicted in FIG. 3A. FIG. 3G is a diagram illustrating the structure of a first signal line layer in an array substrate depicted in FIG. 3A. FIG. 3H is a diagram illustrating the structure of a passivation layer in an array substrate depicted in FIG. 3A. FIG. 3I is a diagram illustrating the structure of a first planarization layer in an array substrate depicted in FIG. 3A. FIG. 3J is a diagram illustrating the structure of a second signal line layer in an array substrate depicted in FIG. 3A. FIG. 3K is a diagram illustrating the structure of a second planarization layer in an array substrate depicted in FIG. 3A. FIG. 3L is a diagram illustrating the structure of an anode layer in an array substrate depicted in FIG. 3A. FIG. 3M is a diagram illustrating the structure of a pixel definition layer in an array substrate depicted in FIG. 3A. FIG. 3N is a diagram illustrating the structure of a touch electrode layer in an array substrate depicted in FIG. 3A.

Figure 4:
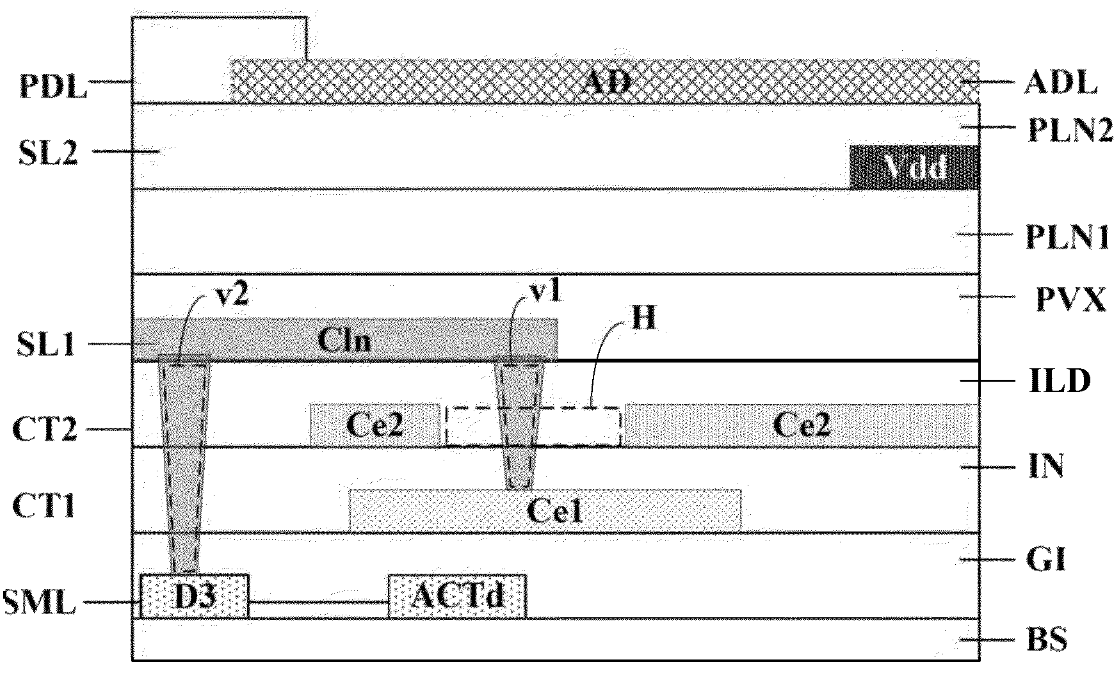
FIG. 4 is a cross-sectional view along an A-A' line in FIG. 3A.

Referring to FIG. 3A to FIG. 3N, and FIG. 4, in some embodiments, the array substrate includes a base substrate BS, a semiconductor material layer SML on the base substrate BS, a gate insulating layer G1 on a side of the semiconductor material layer SML away from the base substrate BS, a first conductive layer CT1 on a side of the gate insulating layer G1 away from the semiconductor material layer SML, an insulating layer IN on a side of the first conductive layer CT1 away from the gate insulating layer G1, a second conductive layer CT2 on a side of the insulating layer IN away from the first conductive layer CT1, an inter-layer dielectric layer ILD on a side of the second conductive layer CT2 away from the insulating layer IN, a first signal line layer SL1 on a side of the inter-layer dielectric layer ILD away from the second conductive layer CT2, a passivation layer PVX on a side of the first signal line layer SL1 away from the inter-layer dielectric layer ILD, a first planarization layer PLN1 on a side of the passivation layer PVX away from the first signal line layer SL1, a second signal line layer SL2 on a side of the first planarization layer PLN1 away from the passivation layer PVX, a second planarization layer PLN2 on a side of the second signal line layer SL2 away from the first planarization layer PLN1, an anode layer ADL on a side of the second planarization layer PLN2 away from the second signal line layer SL2, and a pixel definition layer PDL on a side of the anode layer ADL away from the base substrate BS.

Figure 5:
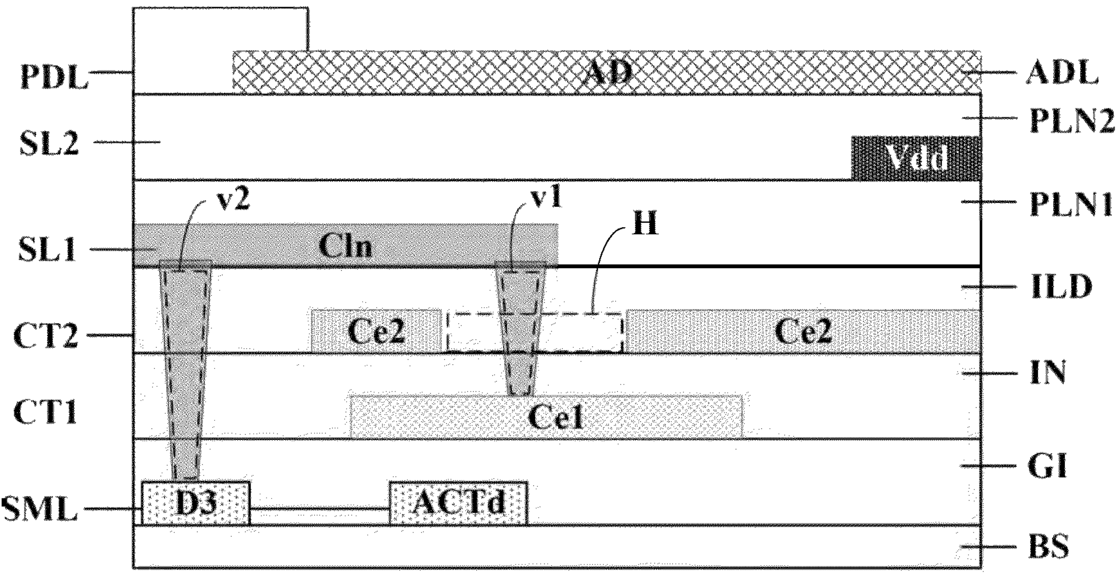
FIG. 5 is a cross-sectional view of an array substrate in some embodiments according to the present disclosure.

In alternative embodiments, the array substrate is absent of the passivation layer PVX (e.g., the passivation layer PVX and the first planarization layer PLN1 are a same layer), FIG. 5 is a cross-sectional view of an array substrate in some embodiments according to the present disclosure. Referring to FIG. 5, the array substrate in some embodiments includes a base substrate BS, a semiconductor material layer SML on the base substrate BS, a gate insulating layer G1 on a side of the semiconductor material layer SML away from the base substrate BS, a first conductive layer CT1 on a side of the gate insulating layer G1 away from the semiconductor material layer SML, an insulating layer IN on a side of the first conductive layer CT1 away from the gate insulating layer G1, a second conductive layer CT2 on a side of the insulating layer IN away from the first conductive layer CT1, an inter-layer dielectric layer ILD on a side of the second conductive layer CT2 away from the insulating layer IN, a first signal line layer SL1 on a side of the inter-layer dielectric layer ILD away from the second conductive layer CT2, a first planarization layer PLN1 on a side of the first signal line layer SL1 away from the inter-layer dielectric layer ILD, a second signal line layer SL2 on a side of the first planarization layer PLN1 away from the first signal line layer SL1, a second planarization layer PLN2 on a side of the second signal line layer SL2 away from the first planarization layer PLN1, an anode layer ADL on a side of the second planarization layer PLN2 away from the second signal line layer SL2, and a pixel definition layer PDL on a side of the anode layer ADL away from the base substrate BS.

Referring to FIG. 2A, FIG. 2B, FIG. 3A, and FIG. 3C, a respective pixel driving circuit is annotated with labels indicating regions corresponding to the plurality of transistors in the respective pixel driving circuit, including the first transistor T1, the second transistor T2, the third transistor T3, the fourth transistor T4, the fifth transistor T5, the sixth transistor T6, and the driving transistor Td. The respective pixel driving circuit is further annotated with labels indicating components of each of the plurality of transistors in the pixel driving circuit. For example, the first transistor T1 includes an active layer ACT1, a first electrode S1, and a second electrode D1. The second transistor T2 includes an active layer ACT2, a first electrode S2, and a second electrode D2. The third transistor T3 includes an active layer ACT3, a first electrode S3, and a second electrode D3. The fourth transistor T4 includes an active layer ACT4, a first electrode S4, and a second electrode D4. The fifth transistor T5 includes an active layer ACT5, a first electrode S5, and a second electrode D5. The sixth transistor T6 includes an active layer ACT6, a first electrode S6, and a second electrode D6. The driving transistor Td includes an active layer ACTd, a first electrode Sd, and a second electrode Dd. In one example, the active layers (ACT1, ACT2, ACT3, ACT4, ACT5, ACT6, and ACTd) of the transistors (T1, T2, T3, T4, T5, T6, and Td) in the respective pixel driving circuit are parts of a unitary structure. In another example, the active layers (ACT1, ACT2, ACT3, ACT4, ACT5, ACT6, and ACTd), the first electrodes (S1, S2, S3, S4, S5, S6, and Sd), and the second electrodes (D1, D2, D3, D4, D5, D6, and Dd) of the transistors (T1, T2, T3, T4, T5, T6, and Td) in the respective pixel driving circuit are parts of a unitary structure. In another example, the active layers (ACT1, ACT2, ACT3, ACT4, ACT5, ACT6, and ACTd) of the transistors (T1, T2, T3, T4, T5, T6, and Td) are in a same layer. In another example, the active layers (ACT1, ACT2, ACT3, ACT4, ACT5, ACT6, and ACTd), the first electrodes (S1, S2, S3, S4, S5, 86, and Sd), and the second electrodes (D1, D2, D3, D4, D5, D6, and Dd) of the transistors (T1, T2, T3, T4, T5, T6, and Td) are in a same layer.

As used herein, the active layer refers to a component of the transistor comprising at least a portion of the semiconductor material layer whose orthographic projection on the base substrate overlaps with an orthographic projection of a gate electrode on the base substrate. A first electrode refers to a component of the transistor connected to one side of the active layer, and a second electrode refers to a component of the transistor connected to another side of the active layer. In the context of a double-gate type transistor (for example, the third transistor T3), the active layer refers to a component of the transistor comprising a first portion of the semiconductor material layer whose orthographic projection on the base substrate overlaps with an orthographic projection of a first gate on the base substrate, a second portion of the semiconductor material layer whose orthographic projection on the base substrate overlaps with an orthographic projection of a second gate on the base substrate, and a third portion between the first portion and the second portion. In the context of a double-gate type transistor, a first electrode refers to a component of the transistor connected to a side of the first portion distal to the third portion, and a second electrode refers to a component of the transistor connected to a side of the second portion distal to the third portion.

Referring to FIG. 2A, FIG. 2B, FIG. 3A, and FIG. 3C, the semiconductor material layer in some embodiments further includes a plurality of first reset signal lines Vint1 and a plurality of second reset signal lines Vint2. A respective first reset signal line of the plurality of first reset signal lines Vint1 is configured to provide a reset signal to the first electrode S1 of the first transistor T1. A respective second reset signal line of the plurality of second reset signal lines Vint2 is configured to provide a reset signal to the first electrode S6 of the sixth transistor T6.

In some embodiments, the plurality of first reset signal lines Vint1 extend along a direction substantially parallel to a first direction DR1, respectively; and the plurality of second reset signal lines Vint2 extend along a direction substantially parallel to the first direction DR1, respectively. In some embodiments, the respective first reset signal line; the respective second reset signal line; the active layers (ACT1, ACT2, ACT3, ACT4, ACT5, ACT6, and ACTd), the first electrodes (S1, S2, S3, S4, S5, S6, and Sd), and the second electrodes (D1, D2, D3, D4, D5, D6, and Dd) of the transistors (T1, T2, T3, T4, T5, T6, and Td) in the respective pixel driving circuit are parts of a unitary structure. In some embodiments, the plurality of first reset signal lines Vint1; the plurality of second reset signal lines Vint2; active layers, at least portions of first electrodes, and at least portions of second electrodes of pixel driving circuits in the array substrate are parts of a unitary structure: In some embodiments, the respective first reset signal line connects first electrode of first transistors in a same row of pixel driving circuits together. In some embodiments, the respective second reset signal line connects first electrode of sixth transistors in a same row of pixel driving circuits together. As used herein, the term "substantially parallel" means that an angle is in the range of 0 degree to approximately 45 degrees, e.g., 0 degree to approximately 5 degrees, 0 degree to approximately 10 degrees, 0 degree to approximately 15 degrees, 0 degree to approximately 20 degrees, 0 degree to approximately 25 degrees, 0 degree to approximately 30 degrees.

As shown in FIG. 3A and FIG. 3C, in some embodiments, the respective first reset signal line is configured to provide reset signals to first electrodes of first transistors in a present row of pixel driving circuits, and configured to provide reset signals to first electrodes of sixth transistors in a previous row of pixel driving circuits. In some embodiments, the respective second reset signal line is configured to provide reset signals to first electrodes of sixth transistors in a present row of pixel driving circuits, and configured to provide reset signals to first electrodes of first transistors in a next row of pixel driving circuits. In some embodiments, the previous row of pixel driving circuits, the present row of pixel driving circuits, and the next row of pixel driving circuits are three sequential rows of pixel driving circuits. Optionally, pixel driving circuits in a same row are arranged along a direction substantially parallel to the first direction DR1.

Referring to FIG. 2A, FIG. 2B, FIG. 3A, and FIG. 3D, the first conductive layer in some embodiments includes a plurality of light emitting control signal lines em, a first gate electrode pad GEP1, a second gate electrode pad GEP2, a third gate electrode pad GEP3, and a first capacitor electrode Ce1 of the storage capacitor Cst. Various appropriate electrode materials and various appropriate fabricating methods may be used to make the first conductive layer. For example, a conductive material may be deposited on the substrate by a plasma-enhanced chemical vapor deposition (PECVD) process and patterned. Examples of appropriate conductive materials for making the first conductive layer include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, the plurality of light emitting control signal lines em, the first gate electrode pad GEP1, the second gate electrode pad GEP2, the third gate electrode pad GEP3, and a first capacitor electrode Ce1 of the storage capacitor Cst are in a same layer.

As used herein, the term "same layer" refers to the relationship between the layers simultaneously formed in the same step. In one example, the plurality of light emitting control signal lines em and the first capacitor electrode Ce1 are in a same layer when they are formed as a result of one or more steps of a same patterning process performed in a same layer of material. In another example, the plurality of light emitting control signal lines em and the first capacitor electrode Ce1 can be formed in a same layer by simultaneously performing the step of forming the plurality of light emitting control signal lines em, and the step of forming the first capacitor electrode Ce1. The term "same layer" does not always mean that the thickness of the layer or the height of the layer in a cross-sectional view is the same.

In some embodiments, the first gate electrode pad GEP1 includes the gate electrode G1 of the first transistor T1 in the pixel driving circuit. In some embodiments, the second gate electrode pad CEP2 includes the gate electrode G3 of the third transistor T3 in the pixel driving circuit. The first gate electrode pad GEP1 is connected to a respective first reset control signal line of a plurality of first reset control signal lines rst1. The second gate electrode pad GEP2 is connected to a respective gate line of a plurality of gate lines GL. In some embodiments, the third gate electrode pad GEP3 includes the gate electrode G6 of the sixth transistor T6 in the pixel driving circuit. The third gate electrode pad GEP3 is connected to a respective second reset control signal line of a plurality of second reset control signal lines rst2.

Referring to FIG. 2A, FIG. 2B, FIG. 3A, and FIG. 3E, the second conductive layer in some embodiments includes a second capacitor electrode Ce2 of the storage capacitor Cst. Various appropriate conductive materials and various appropriate fabricating methods may be used to make the second conductive layer. For example, a conductive material may be deposited on the substrate by a plasma-enhanced chemical vapor deposition (PECVD) process and patterned. Examples of appropriate conductive materials for making the second conductive layer include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like.

In some embodiments, second capacitor electrodes of storage capacitors of pixel driving circuits in a same row are connected to each other, forming a unitary structure. In some embodiments, the second capacitor electrode Ce2 includes a main body MB and an extension part EP extending away from the main body MB. Optionally, the unitary structure comprising the second capacitor electrodes of storage capacitors of pixel driving circuits in the same row extends along a direction substantially parallel to the first direction DR1. Optionally, the extension part EP extends away from the main body MB along a direction substantially parallel to a second direction DR2. The second direction DR2 is different from the first direction DR1. In one example, the second direction DR2 is perpendicular to the first direction DR1, Optionally, an orthographic projection of a respective voltage supply line of a plurality of voltage supply lines on a base substrate covers an orthographic projection of the extension part EP on the base substrate.

Vias extending through the inter-layer dielectric layer ILD are depicted in FIG. 3F.

Referring to FIG. 2A, FIG. 2B, FIG. 3A, and FIG. 3G, the first signal line layer in some embodiments includes a node connecting line Cln, a plurality of gate lines GL, a plurality of first reset control signal lines rst1, a plurality of second reset control signal lines rst2, a first reset connecting pad RCP1, a second reset connecting pad RCP2, a relay electrode RE, a voltage connecting pad VCP, and a data signal connecting pad DCP. Various appropriate conductive materials and various appropriate fabricating methods may be used to make the first signal line layer. For example, a conductive material may be deposited on the substrate by a plasma-enhanced chemical vapor deposition (PECVD) process and patterned. Examples of appropriate conductive materials for making the first signal line layer include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, the node connecting line Cln, the plurality of gate lines GL, the plurality of first reset control signal lines rst1, the plurality of second reset control signal lines rst2, the first reset connecting pad RCP1, the second reset connecting pad RCP2, the relay electrode RE, the voltage connecting pad VCP, and the data signal connecting pad DCP are in a same layer.

The node connecting line Cln connects the first capacitor electrode Ce1 and the second electrode of the third transistor T3 in a respective pixel driving circuit together. The data signal connecting pad DCP is configured to connect a respective data line of the plurality of data lines to a first electrode of the second transistor T2. The relay electrode RE connects the fourth node N4 and an anode connecting pad together. The relay electrode is connected to second electrodes of the fifth transistor T5 and the sixth transistor T6. The anode connecting pad is in the second signal line layer, and is connected to an anode in a respective subpixel. The voltage connecting pad VCP connects a respective voltage supply line with the second capacitor electrode Ce2 of the storage capacitor. For example, the respective first voltage supply line is connected to the voltage connecting pad VCP, and the voltage connecting pad VCP is connected to the second capacitor electrode Ce2 of the storage capacitor.

In some embodiments, referring to FIG. 4, FIG. 5, FIG. 3A to FIG. 3M, an orthographic projection of the second capacitor electrode Ce2 on a base substrate BS completely covers, with a margin, an orthographic projection of the first capacitor electrode Ce1 on the base substrate BS except for a hole region H in which a portion of the second capacitor electrode Ce2 is absent. In some embodiments, the first signal line layer includes a node connecting line Cln on a side of the inter-layer dielectric layer ILD away from the second capacitor electrode Ce2.

In some embodiments, the first capacitor electrode Ce1 is on a side of the gate insulating layer IN away from the base substrate BS. Optionally, the array substrate further includes a first via v1 and a second via v2. The first via v1 is in the hole region H and extends through the inter-layer dielectric layer ILD and the insulating layer IN. The second via v2 extends through the inter-layer dielectric layer ILD, the insulating layer IN, and the gate insulating layer G1. Optionally, the node connecting line Cln is connected to the first capacitor electrode Ce1 through the first via v1, and the node connecting line Cln is connected to the semiconductor material layer SML through the second via v2. Optionally, the node connecting line Cln is connected to the second electrode D3 of third transistor, as depicted in FIG. 4 and FIG. 5.

In some embodiments, the plurality of first reset control signal lines rst1 extend along a direction substantially parallel to a first direction DR1, respectively; and the plurality of second reset control signal lines rst2 extend along a direction substantially parallel to the first direction DR1, respectively. In some embodiments, the respective first reset control signal line is configured to provide reset control signals to gate electrodes of first transistors of pixel driving circuits in a same row. In some embodiments, the respective second reset control signal line is configured to provide reset control signals to gate electrodes of sixth transistors of pixel driving circuits in a same row.

As shown in FIG. 3A and FIG. 3G, in some embodiments, the respective first reset control signal line is configured to provide reset control signals to gate electrodes of first transistors of pixel driving circuits in a present row of pixel driving circuits, and configured to provide reset control signals to gate electrodes of sixth transistors in a previous row of pixel driving circuits. In some embodiments, the respective second reset control signal line is configured to provide reset control signals to gate electrodes of sixth transistors in a present row of pixel driving circuits, and configured to provide reset control signals to gate electrodes of first transistors in a next row of pixel driving circuits. In some embodiments, the previous row of pixel driving circuits, the present row of pixel driving circuits, and the next row of pixel driving circuits are three sequential rows of pixel driving circuits. Optionally, pixel driving circuits in a same row are arranged along a direction substantially parallel to the first direction DR1.

The first reset connecting pad RCP1 connects a respective first reset signal line with an individual third reset signal line of a plurality of third reset signal lines. The second reset connecting pad RCP2 connects a respective second reset signal line with the individual third reset signal line of a plurality of third reset signal lines. The respective first reset signal line is configured to provide reset signals to first electrodes of first transistors in a present row of pixel driving circuits, and configured to provide reset signals to first electrodes of sixth transistors in a previous row of pixel driving circuits. The respective second reset signal line is configured to provide reset signals to first electrodes of sixth transistors in a present row of pixel driving circuits, and configured to provide reset signals to first electrodes of first transistors in a next row of pixel driving circuits. In some embodiments, the previous row of pixel driving circuits, the present row of pixel driving circuits, and the next row of pixel driving circuits are three sequential rows of pixel driving circuits. Optionally, pixel driving circuits in a same row are arranged along a direction substantially parallel to the first direction DR1.

Vias extending through the first planarization layer PLN1 are depicted in FIG. 3H.

Vias extending through the passivation layer PVX are depicted in FIG. 3I.

Referring to FIG. 2A, FIG. 2B, FIG. 3A, and FIG. 3J, the second signal line layer in some embodiments includes a plurality of voltage supply lines Vdd, a plurality of data lines DL, a plurality of constant voltage signal lines Vc, and an anode contact pad ACP. The anode contact pad ACP is electrically connected to second electrodes of the fifth transistor T5 and the sixth transistor T6 in the respective pixel driving circuit through a relay electrode. The anode contact pad ACP is electrically connected to an anode of a light emitting element in a respective subpixel. The plurality of voltage supply lines Vdd are connected to a voltage supply pad in the first signal line layer, as discussed above. A respective data line of the plurality of data lines is electrically connected to a first electrode of the second transistor T2 through a data signal connecting pad.

Various appropriate conductive materials and various appropriate fabricating methods may be used to make the second signal line layer. For example, a conductive material may be deposited on the substrate by a plasma-enhanced chemical vapor deposition (PECVD) process and patterned. Examples of appropriate conductive materials for making the second signal line layer include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, the plurality of voltage supply lines Vdd, the plurality of data lines DL, the plurality of constant voltage signal lines Vc, and the anode contact pad ACP are in a same layer.

In some embodiments, the plurality of constant voltage signal lines Vc are a plurality of third reset signal lines. As discussed above, the first reset connecting pad connects a respective first reset signal line with an individual third reset signal line of a plurality of third reset signal lines. The second reset connecting pad connects a respective second reset signal line with the individual third reset signal line of a plurality of third reset signal lines. In some embodiments, the plurality of first reset signal lines, the plurality of second reset signal lines, and the plurality of third reset signal lines (e.g., the plurality of constant voltage signal lines Vc) form an interconnected reset signal network.

Figure 6:
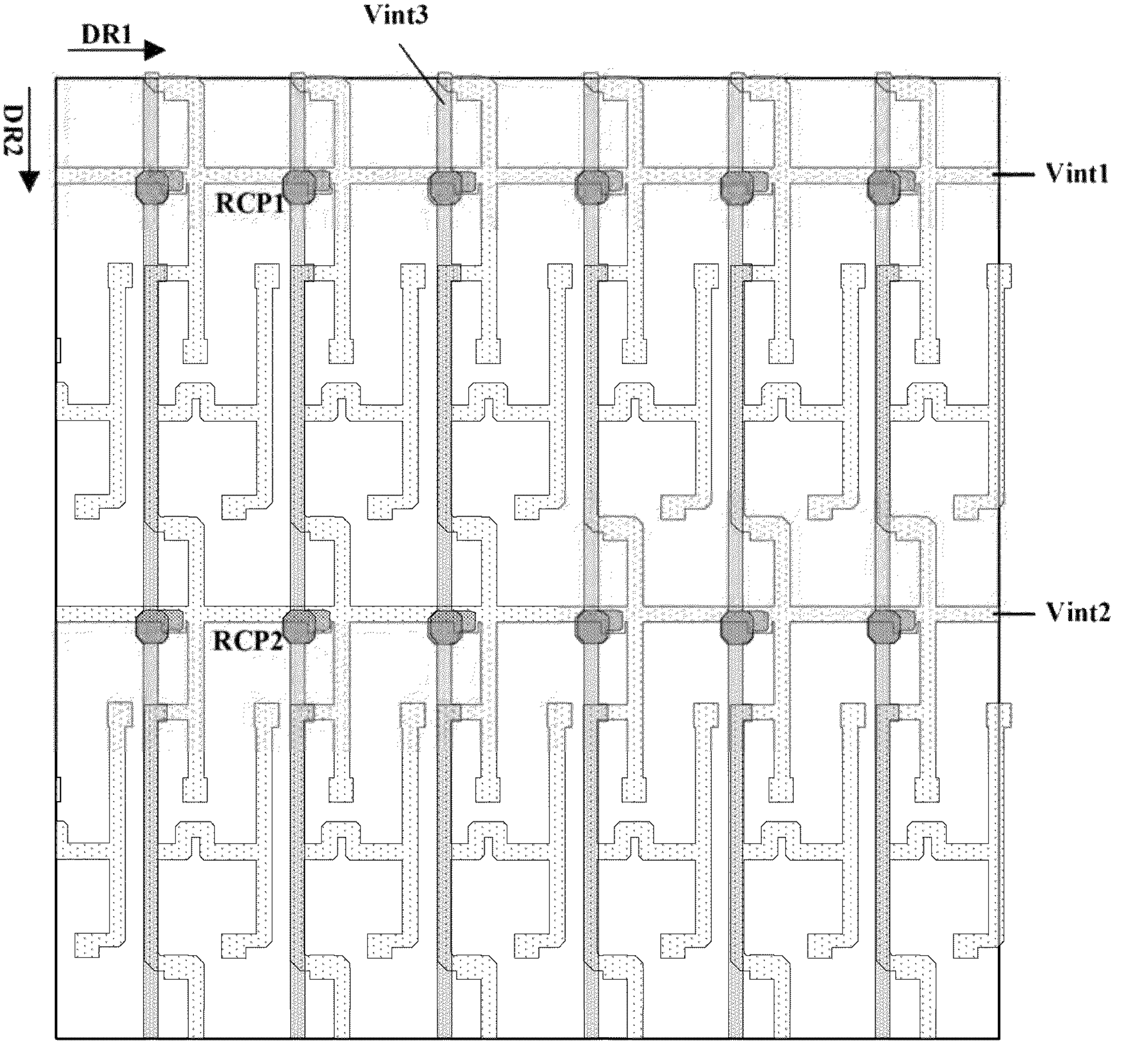
FIG. 6 illustrates an interconnected reset signal network in some embodiments according to the present disclosure.

FIG. 6 illustrates an interconnected reset signal network in some embodiments according to the present disclosure. Referring to FIG. 6, the interconnected reset signal network in some embodiments includes a plurality of first reset signal lines Vint1, a plurality of second reset signal lines Vint2, and a plurality of third reset signal lines Vint3 interconnected together. The plurality of first reset signal lines Vint extend along a direction substantially parallel to a first direction DR1; the plurality of second reset signal lines Vint2 extend along a direction substantially parallel to the first direction DR1; and the plurality of third reset signal lines Vint3 extend along a direction substantially parallel to a second direction DR2. In one example, the plurality of first reset signal lines Vint1 and the plurality of second reset signal lines Vint2 are in the semiconductor material layer. In another example, the plurality of third reset signal lines Vint3 are in the second signal line layer. Optionally, a respective first reset signal line is connected to one or more third reset signal lines of the plurality of third reset signal lines Vint3. Optionally, a respective second reset signal line is connected to one or more third reset signal lines of the plurality of third reset signal lines Vint3. Optionally, a respective third reset signal line of the plurality of third reset signal lines Vint3 is connected to one or more first reset signal lines of the plurality of first reset signal lines Vint1 and connected to one or more second reset signal lines of the plurality of second reset signal lines Vint2.

In alternative embodiments, the plurality of constant voltage signal lines Vc are a plurality of low voltage signal lines, for example, configured to provide a low voltage signal to a cathode of a light emitting element in the array substrate.

Figure 7:
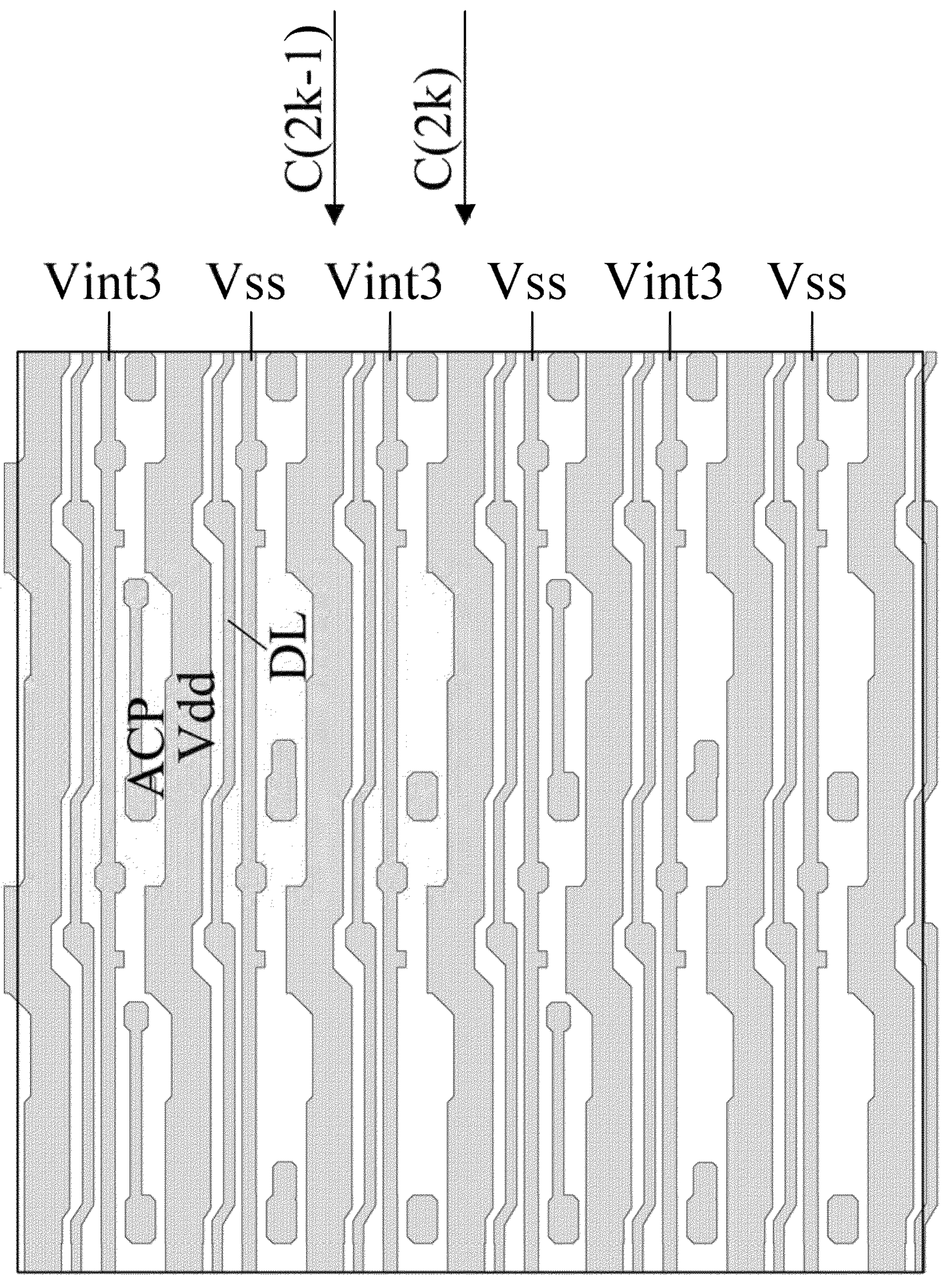
FIG. 7 is a diagram illustrating the structure of a second signal line layer in an array substrate in some embodiments according to the present disclosure.

In alternative embodiments, the plurality of constant voltage signal lines Vc includes a plurality of third reset signal lines and a plurality of low voltage signal lines alternately arranged. FIG. 7 is a diagram illustrating the structure of a second signal line layer in an array substrate in some embodiments according to the present disclosure, Referring to FIG. 7, the array substrate in some embodiments includes a plurality of voltage supply lines Vdd, a plurality of low voltage signal lines Vss, a plurality of third reset signal lines Vint3, and a plurality of data lines DL. In some embodiments, the plurality of pixel driving circuits are arranged in columns, including (2k−1)-th column C(2k−1), and (2k)-th column C(2k) of K columns, K and k being positive integers, 1≤k≤(K/2). Referring to FIG. 7, in some embodiments, the plurality of third reset signal lines Vint3 are present in the (2k−1)-th column C(2k−1), and are absent in the (2k)-th column C(2k). The plurality of low voltage signal lines Vss are present in the (2k)-th column C(2k), and are absent in the (2k−1)-th column C(2k−1). In some embodiments, the plurality of first reset signal lines, the plurality of second reset signal lines, and the plurality of third reset signal Vint3 form an interconnected reset signal network.

As used herein, the terms "(2k−1)-th column" and "(2k)-th column" are used in the context of the K columns. The array substrate may or may not include additional column(s) before the first column of the K columns and/or additional columns after the last column of the K columns. In the context of the array substrate, the term "(2k−1)-th column" does not necessarily denote an odd-numbered column, and the term "(2k)-th column" does not necessarily denote an even-numbered column. In one example, the (2k−1)-th column is an odd-numbered column in the context of the K columns, but may be an even-numbered column in the context of the array substrate. In another example, the (2k−1)-th column is an odd-numbered column in the context of the K columns, and also an odd-numbered column in the context of the array substrate. In one example, the (2k)-th column is an even-numbered column in the context of the K columns, but may be an odd-numbered column in the context of the array substrate. In another example, the (2k)-th column is an even-numbered column in the context of the K columns, and also an even-numbered column in the context of the array substrate.

Figure 8:
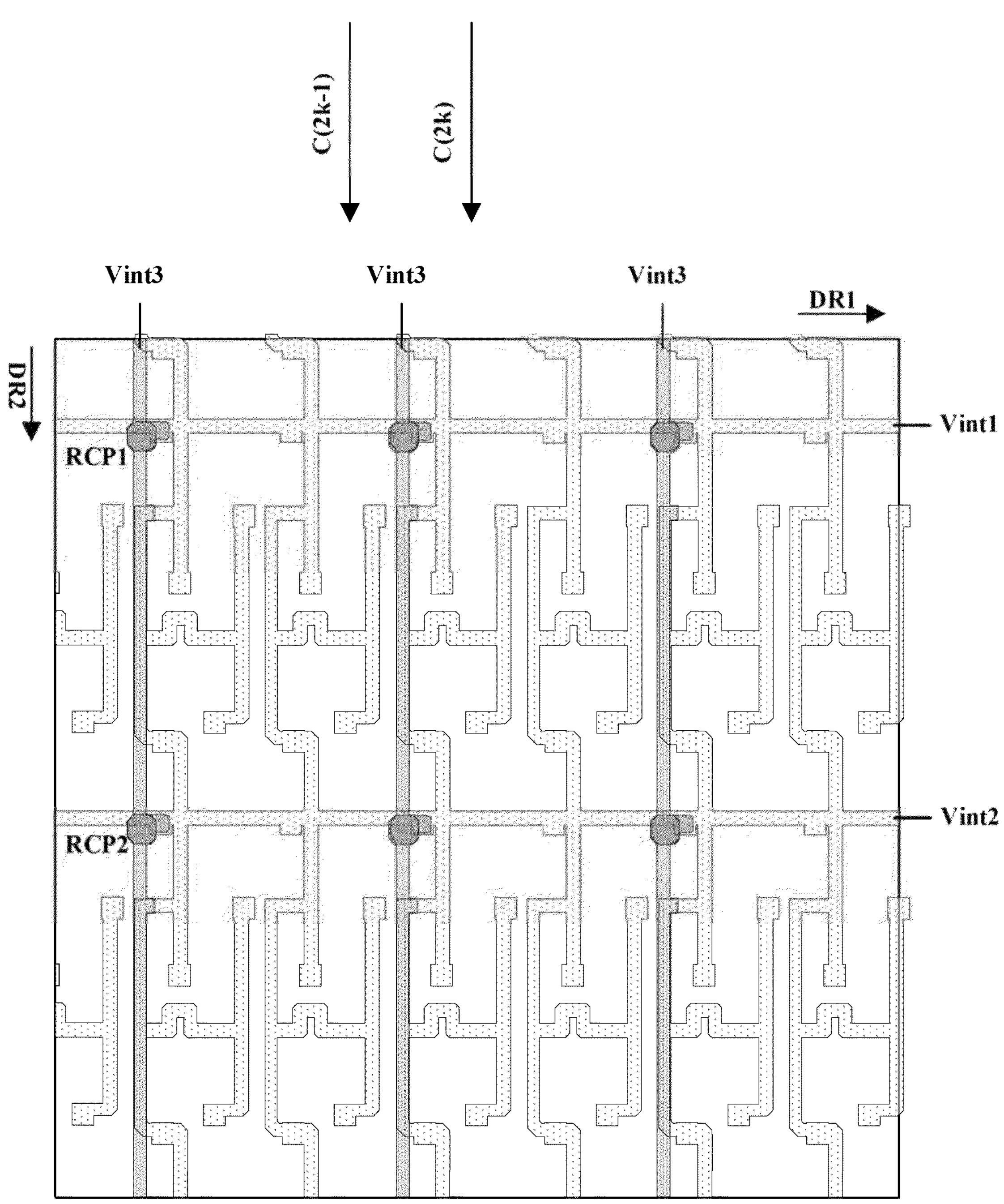
FIG. 8 illustrates an interconnected reset signal network in some embodiments according to the present disclosure.

FIG. 8 illustrates an interconnected reset signal network in some embodiments according to the present disclosure. Referring to FIG. 8, the interconnected reset signal network in some embodiments includes a plurality of first reset signal lines Vint1, a plurality of second reset signal lines Vint2, and a plurality of third reset signal lines Vint3 interconnected together. The plurality of third reset signal lines Vint3 are present in the (2k−1)-th column C(2k−1), and are absent in the (2k)-th column C(2k). Optionally, a respective first reset signal line is connected to one or more third reset signal lines of the plurality of third reset signal lines Vint3. Optionally, a respective second reset signal line is connected to one or more third reset signal lines of the plurality of third reset signal lines Vint3. Optionally, a respective third reset signal line of the plurality of third reset signal lines Vint3 is connected to one or more first reset signal lines of the plurality of first reset signal lines Vint1 and connected to one or more second reset signal lines of the plurality of second reset signal lines Vint2.

Vias extending through the second planarization layer PLN2 are depicted in FIG. 3K.

Referring to FIG. 2A, FIG. 2B, FIG. 3A, and FIG. 3L, the array substrate further includes an anode layer ADL. A plurality of subpixel apertures SA respectively corresponding to a plurality of anodes are denoted in FIG. 3L. Vias extending through the second planarization layer PLN2 are depicted in FIG. 3K. A respective anode is connected to a respective anode contact pad through a respective via extending through the second planarization layer PLN2.

Referring to FIG. 2A, FIG. 2B, FIG. 3A, and FIG. 3M, the array substrate further includes a pixel definition layer PDL defining a plurality of subpixel apertures SA.

Referring to FIG. 2A, FIG. 2B, FIG. 3A, and FIG. 3N, the touch electrode layer in some embodiments include a plurality of touch electrode lines TEL, e.g., a plurality of touch electrode mesh lines. In some embodiments, the plurality of touch electrode lines TEL comprise a plurality of first touch electrode lines TEL1 and a plurality of second touch electrode lines TEL2. Optionally, the plurality of first touch electrode lines TEL1 extend along a direction substantially parallel to a first direction DR1, and the plurality of second touch electrode lines TEL2 extend along a direction substantially parallel to a second direction DR2, the first direction DR1 and the second direction DR2 being different from each other.

Figure 9:
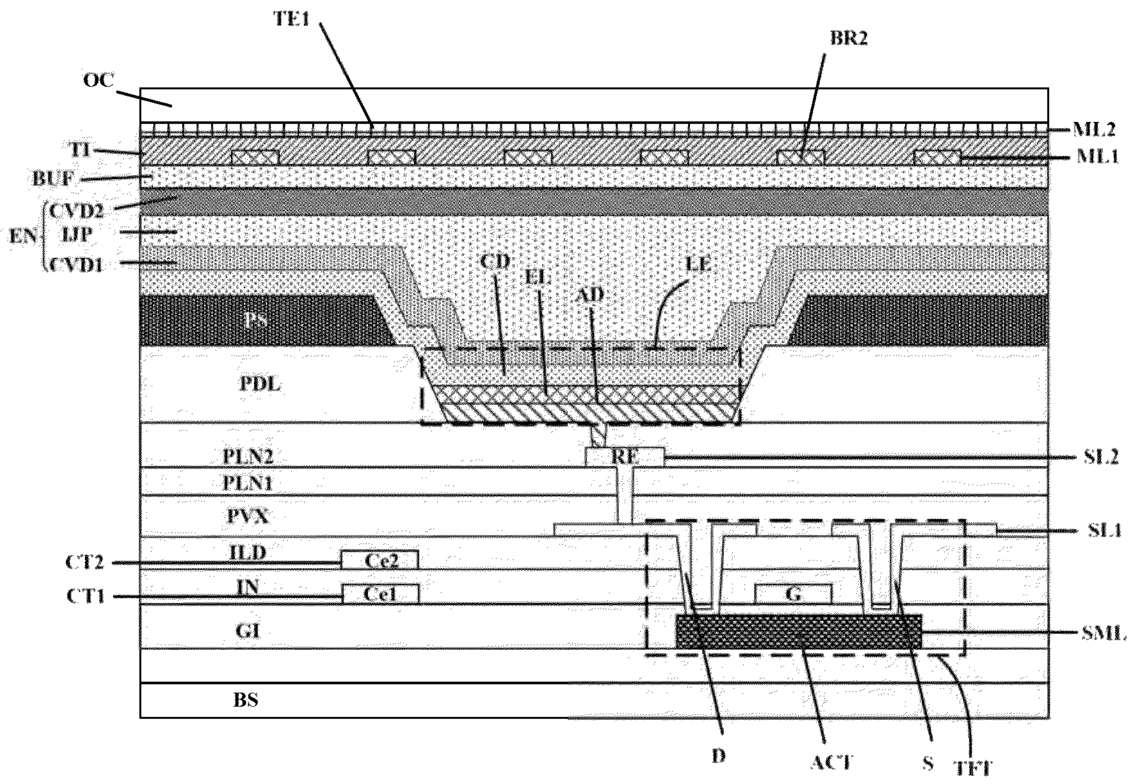
FIG. 9 illustrates a detailed structure in a display area in an array substrate in some embodiments according to the present disclosure.

FIG. 9 illustrates a detailed structure in a display area in an array substrate in some embodiments according to the present disclosure, Referring to FIG. 9, the array substrate in the display area in some embodiments includes a base substrate BS (e.g., a flexible base substrate); an active layer ACT of a respective one of a plurality of thin film transistors TFT on the base substrate BS; a gate insulating layer G1 on a side of the active layer ACT away from the base substrate BS; a gate electrode G and a first capacitor electrode Ce1 (both are parts of a first gate metal layer) on a side of the gate insulating layer G1 away from the base substrate BS; an insulating layer IN on a side of the gate electrode G and the first capacitor electrode Ce1 away from the gate insulating layer G1; a second capacitor electrode Ce2 (a part of a second gate metal layer) on a side of the insulating layer IN away from the gate insulating layer G1; an inter-layer dielectric layer ILD on a side of the second capacitor electrode Ce2 away from the gate insulating layer G1; a source electrode S and a drain electrode D (parts of a first SD metal layer) on a side of the inter-layer dielectric layer ILD away from the gate insulating layer G1; a passivation layer PVX on a side of the source electrode S and the drain electrode D away from the inter-layer dielectric layer ILD; a first planarization layer PLN1 on a side of the passivation layer PVX away from the inter-layer dielectric layer ILD; a relay electrode RE (a part of a second SD metal layer) on a side of the first planarization layer PLN1 away from the passivation layer PVX; a second planarization layer PLN2 on side of the first planarization layer PLN1 away from the passivation layer PVX; a pixel definition layer PDL defining a subpixel aperture and on a side of the second planarization layer PLN2 away from the base substrate BS; and a light emitting element LE in the subpixel aperture. The light emitting element LE includes an anode AD on a side of the second planarization layer PLN2 away from the first planarization layer PLN1; a light emitting layer EL on a side of the anode AD away from the second planarization layer PLN2; and a cathode layer CD on a side of the light emitting layer EL away from the anode AD. The array substrate in the display area further includes an encapsulating layer EN encapsulating the light emitting element LE, and on a side of the cathode layer CD away from the base substrate BS. The encapsulating layer EN in some embodiments includes a first inorganic encapsulating sub-layer CVD1 on a side of the cathode layer CD away from the base substrate BS, an organic encapsulating sub-layer IJP on a side of the first inorganic encapsulating sub-layer CVD1 away from the base substrate BS, and a second inorganic encapsulating sub-layer CVD2 on a side of the organic encapsulating sub-layer IJP away from the first inorganic encapsulating sub-layer CVD1. The array substrate in the display area further includes a buffer layer BUF on a side of the encapsulating layer EN away from the base substrate BS; a plurality of second electrode bridges BR2 on a side of the buffer layer BUF away from the encapsulating layer EN; a touch insulating layer T1 on a side of the plurality of second electrode bridges BR2 away from the buffer layer BUF; a plurality of first touch electrodes TEL on a side of the touch insulating layer T1 away from the buffer layer BUF; and an overcoat layer OC on a side of the plurality of first touch electrodes TE1 away from the touch insulating layer T1. Optionally, the array substrate in the display area does not include the passivation layer PVX, e.g., the inter-layer dielectric layer ILD is in direct contact with the first planarization layer PLN1.

Referring to FIG. 9, the array substrate includes a semiconductor material layer SML, a first conductive layer CT1, a second conductive layer CT2, a first signal line layer SL1, and a second signal line layer SL2. The array substrate further includes an insulating layer IN between the first conductive layer CT1 and the second conductive layer CT2; an inter-layer dielectric layer ILD between the second conductive layer CT2 and the first signal line layer SL1; and at least a passivation layer PVX or a first planarization layer PLN1 between the first signal line layer SL1 and the second signal line layer SL2.

Referring to FIG. 9, the plurality of first touch electrodes TE1 are in a first metal layer ML1, and the plurality of second electrode bridges BR2 are in a second metal layer ML2. In some embodiments, the plurality of first touch electrode lines TEL1 and the plurality of second touch electrode lines TEL2 are in the second metal layer ML2. In alternative embodiments, the plurality of first touch electrode lines TEL1 and the plurality of second touch electrode lines TEL2 are in the first metal layer ML1. In alternative embodiments, the plurality of first touch electrode lines TEL1 and the plurality of second touch electrode lines TEL2 are partially in the first metal layer ML1 and partially in the second metal layer ML2.

Figure 10:
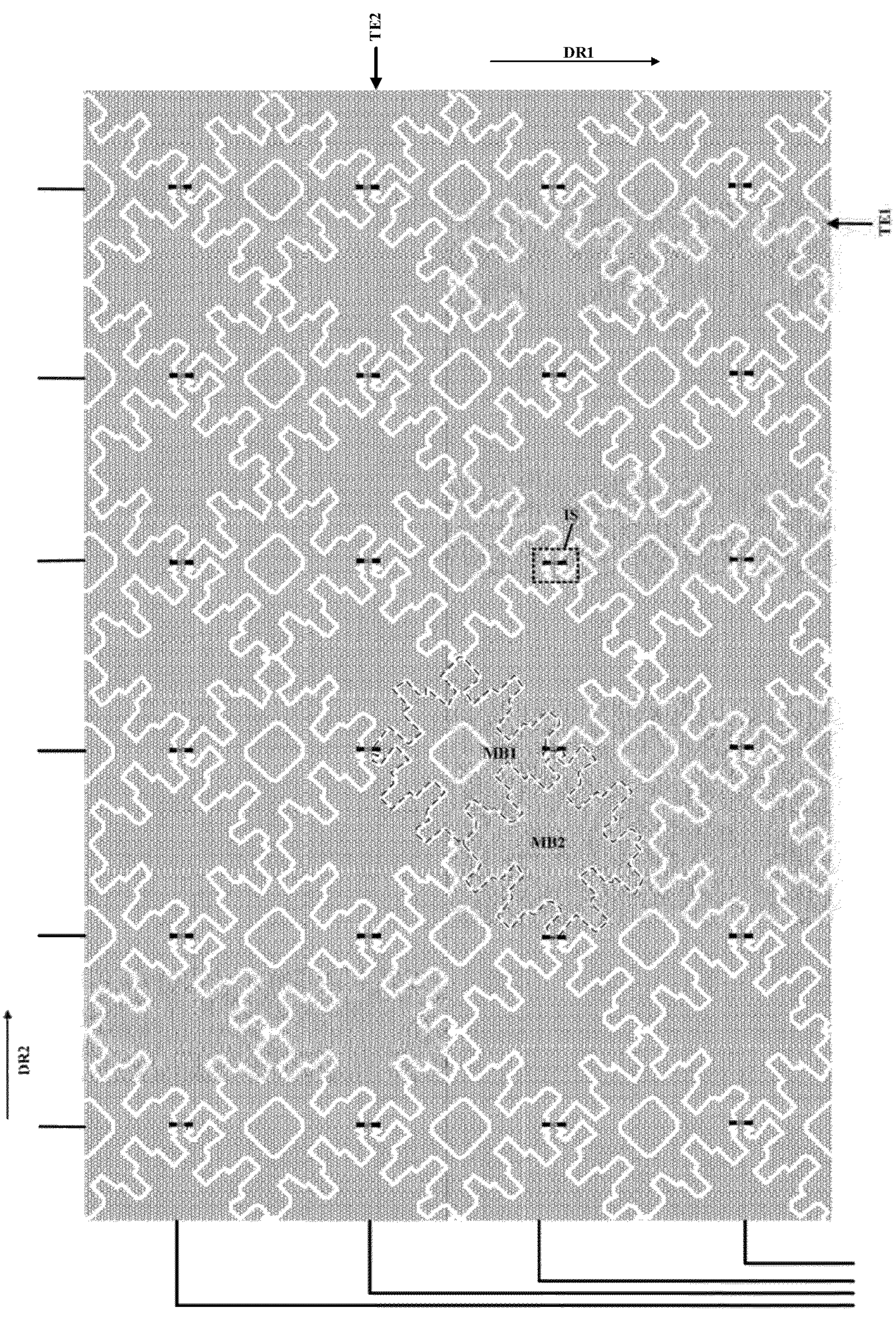
FIG. 10 is a schematic diagram illustrating the structure of an array substrate in some embodiments according to the present disclosure.

FIG. 10 is a schematic diagram illustrating the structure of a display panel in some embodiments according to the present disclosure. Referring to FIG. 10, the touch control structure in some embodiments includes a plurality of first mesh electrodes TE1 arranged in a plurality of rows and a plurality of second mesh electrodes TE2 arranged in a plurality of columns. The plurality of first mesh electrodes TE1 are arranged in a plurality of rows, each of the plurality of rows is a respective one of the plurality of first mesh electrodes TE1. The plurality of second mesh electrodes TE2 arranged in a plurality of columns, each of the plurality of columns is a respective one of the plurality of second mesh electrodes TE2. Optionally, the touch control structure is a mutual capacitance type touch control structure. Optionally, the plurality of first mesh electrodes TE1 are a plurality of touch sensing electrodes, and the plurality of second mesh electrodes TE2 are a plurality of touch scanning electrodes. Optionally, the plurality of first mesh electrodes TE1 are a plurality of touch scanning electrodes, and the plurality of second mesh electrodes TE2 are a plurality of touch sensing electrodes.

As shown in FIG. 10, a respective one of the plurality of first mesh electrodes TE1 includes a plurality of first mesh blocks MB1 consecutively electrically connected in a respective row along a first direction DR1, a respective one of the plurality of second mesh electrodes TE2 includes a plurality of second mesh blocks MB2 consecutively electrically connected in a respective column along a second direction DR2. In FIG. 10, a respective one of the plurality of first mesh blocks MB1 and a respective one of the plurality of second mesh blocks MB2 are depicted as blocks respectively encircled by dotted lines.

Figure 11:
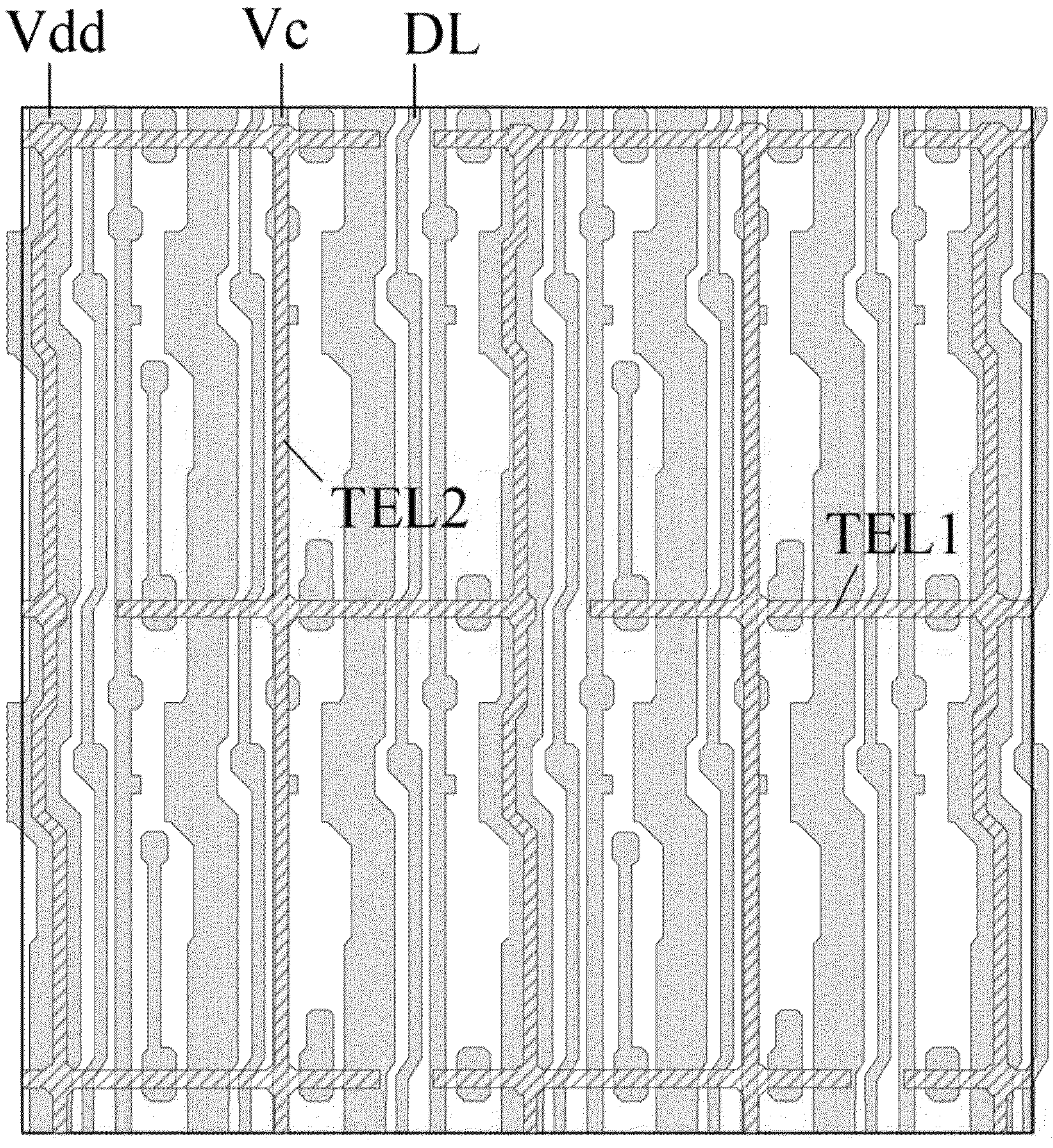
FIG. 11 is a diagram illustrating the structure of a second signal line layer and a touch electrode layer in an array substrate depicted in FIG. 3A.
Figure 12:
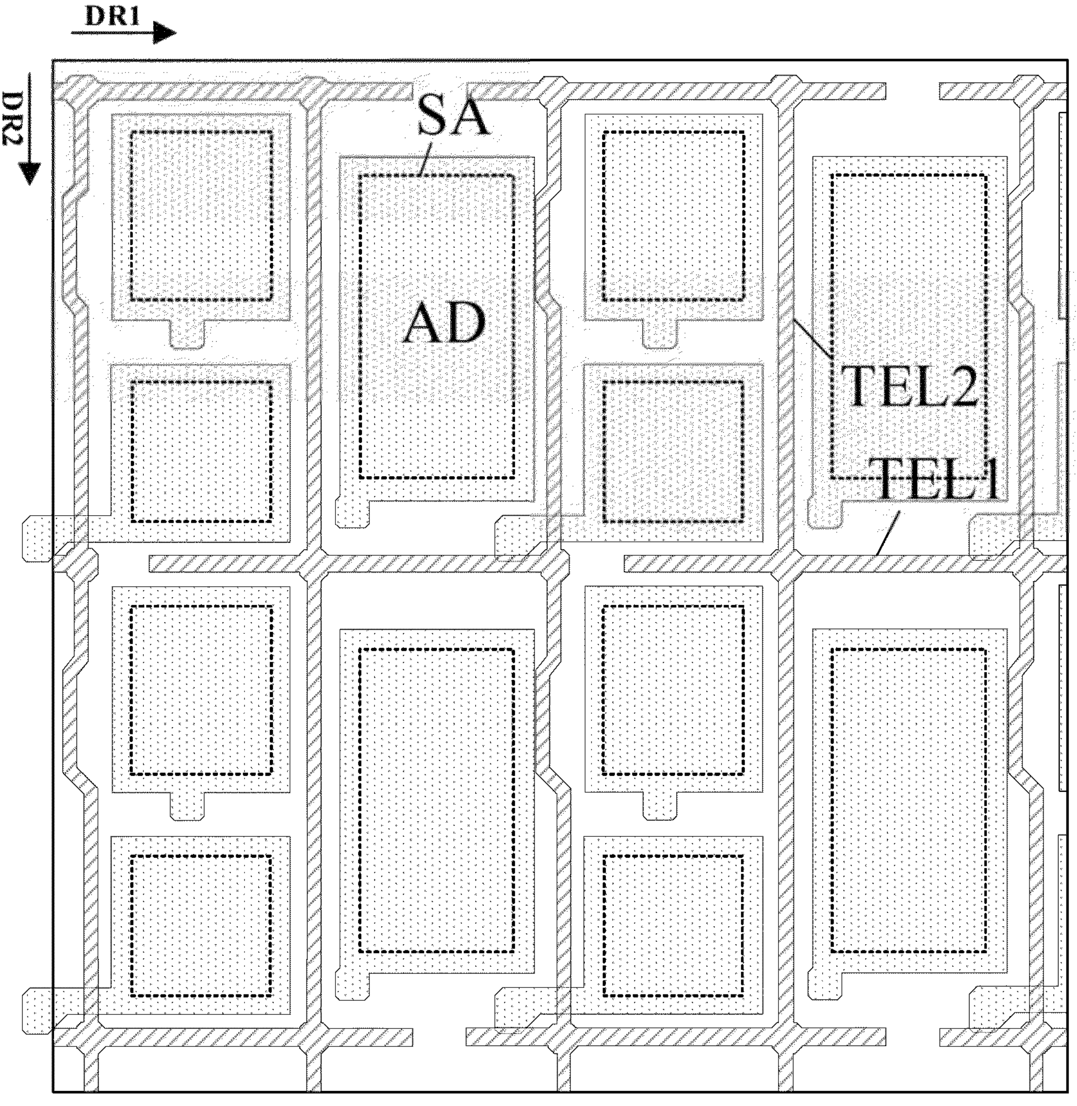
FIG. 12 is a diagram illustrating the structure of an anode layer and a touch electrode layer in an array substrate depicted in FIG. 3A.
Figure 13:
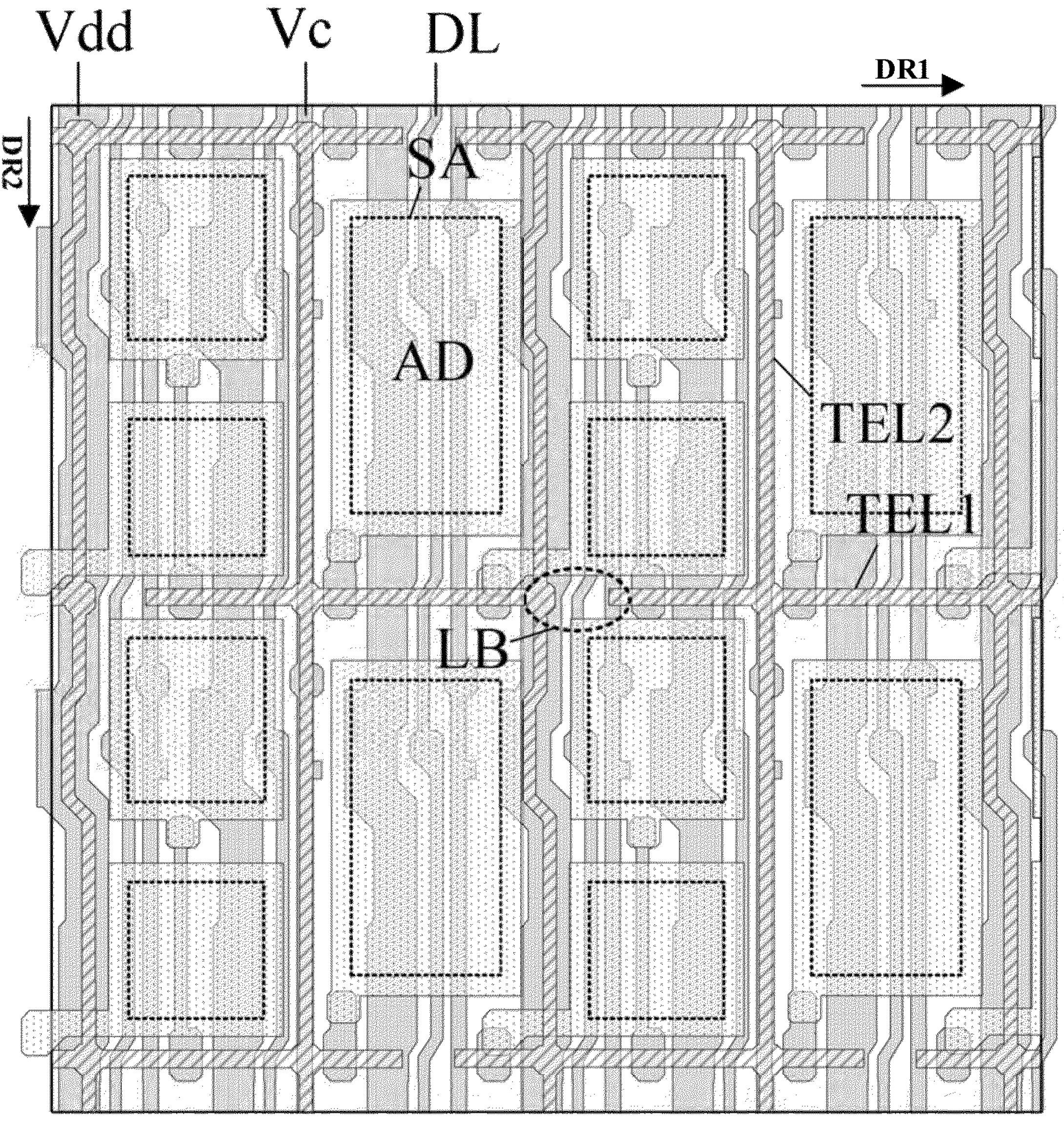
FIG. 13 is a diagram illustrating the structure of a second signal line layer, an anode layer, and a touch electrode layer in an array substrate depicted in FIG. 3A.

FIG. 11 is a diagram illustrating the structure of a second signal line layer and a touch electrode layer in an array substrate depicted in FIG. 3A. FIG. 12 is a diagram illustrating the structure of an anode layer and a touch electrode layer in an array substrate depicted in FIG. 3A. FIG. 13 is a diagram illustrating the structure of a second signal line layer, an anode layer, and a touch electrode layer in an array substrate depicted in FIG. 3A, Referring to FIG. 11 to FIG.

13, in some embodiments, an orthographic projection of the plurality of touch electrode lines on a base substrate is substantially non-overlapping (e.g., at least 75% non-overlapping, at least 80% non-overlapping, at least 85% non-overlapping, at least 90% non-overlapping, at least 95% non-overlapping, at least 99% non-overlapping, or 100%) with an orthographic projection of a light emitting material in the plurality of subpixel apertures SA on the base substrate. In one example, the orthographic projection of the plurality of touch electrode lines on the base substrate is completely non-overlapping with the orthographic projection of the light emitting material in the plurality of subpixel apertures SA on the base substrate. In some embodiments, in at least adjacent 4 pixels (e.g., in at least adjacent 8 pixels, in at least adjacent 16 pixels, in at least adjacent 32 pixels, in at least adjacent 64 pixels, in at least adjacent 128 pixels, or in at least adjacent 264 pixels), the orthographic projection of the plurality of touch electrode lines on the base substrate is substantially non-overlapping (e.g., at least 75% non-overlapping, at least 80% non-overlapping, at least 85% non-overlapping, at least 90% non-overlapping, at least 95% non-overlapping, at least 99% non-overlapping, or 100%) with the orthographic projection of the light emitting material in the plurality of subpixel apertures SA on the base substrate. Optionally, in at least adjacent 4 pixels (e.g., in at least adjacent 8 pixels, in at least adjacent 16 pixels, in at least adjacent 32 pixels, in at least adjacent 64 pixels, in at least adjacent 128 pixels, or in at least adjacent 264 pixels), the orthographic projection of the plurality of touch electrode lines on the base substrate is completely non-overlapping with the orthographic projection of the light emitting material in the plurality of subpixel apertures SA on the base substrate. Each pixel includes one or more subpixels. Each subpixel includes an anode.

In some embodiments, an orthographic projection of the plurality of touch electrode lines on a base substrate is substantially non-overlapping (e.g., at least 75% non-overlapping, at least 80% non-overlapping, at least 85% non-overlapping, at least 90% non-overlapping, at least 95% non-overlapping, at least 99% non-overlapping, or 100% non-overlapping) with an orthographic projection of a plurality of anodes of a plurality of light emitting elements on the base substrate. In some embodiments, in at least adjacent 4 pixels (e.g., in at least adjacent 8 pixels, in at least adjacent 16 pixels, in at least adjacent 32 pixels, in at least adjacent 64 pixels, in at least adjacent 128 pixels, or in at least adjacent 264 pixels), the orthographic projection of the plurality of touch electrode lines on a base substrate is substantially non-overlapping (e.g., at least 75% non-overlapping, at least 80% non-overlapping, at least 85% non-overlapping, at least 90% non-overlapping, at least 95% non-overlapping, at least 99% non-overlapping, or 100% non-overlapping) with the orthographic projection of a plurality of anodes of the plurality of light emitting elements on the base substrate. Each pixel includes one or more subpixels. Each subpixel includes an anode.

In some embodiments, an orthographic projection of the plurality of second touch electrode lines TEL2 on a base substrate at least partially (e.g., at least 50%, at least 60%, at least 70%, at least 80%, at least 90%, at least 95%, at least 99%, or 100%) overlaps with an orthographic projection of a combination of the plurality of voltage supply lines Vdd and the plurality of constant voltage signal lines Vc on the base substrate. In some embodiments, in at least adjacent 4 pixels (e.g., in at least adjacent 8 pixels, in at least adjacent 16 pixels, in at least adjacent 32 pixels, in at least adjacent 64 pixels, in at least adjacent 128 pixels, or in at least adjacent 264 pixels), the orthographic projection of the plurality of second touch electrode lines TEL2 on the base substrate at least partially (e.g., at least 50%, at least 60%, at least 70%, at least 80%, at least 90%, at least 95%, at least 99%, or 100%) overlaps with the orthographic projection of the combination of the plurality of voltage supply lines Vdd and the plurality of constant voltage signal lines Vc on the base substrate. Each pixel includes one or more subpixels. Each subpixel includes an anode.

In some embodiments, an orthographic projection of the plurality of second touch electrode lines TEL2 on a base substrate is substantially non-overlapping (e.g., at least 75% non-overlapping, at least 80% non-overlapping, at least 85% non-overlapping, at least 90% non-overlapping, at least 95% non-overlapping, at least 99% non-overlapping, or 100% non-overlapping) with an orthographic projection of the plurality of data lines DL on the base substrate. In some embodiments, in at least adjacent 4 pixels (e.g., in at least adjacent 8 pixels, in at least adjacent 16 pixels, in at least adjacent 32 pixels, in at least adjacent 64 pixels, in at least adjacent 128 pixels, or in at least adjacent 264 pixels), the orthographic projection of the plurality of second touch electrode lines TEL2 on the base substrate is substantially non-overlapping (e.g., at least 75% non-overlapping, at least 80% non-overlapping, at least 85% non-overlapping, at least 90% non-overlapping, at least 95% non-overlapping, at least 99% non-overlapping, or 100% non-overlapping) with the orthographic projection of the plurality of data lines DL on the base substrate.

The inventors of the present disclosure discover that, by having the orthographic projection of the plurality of second touch electrode lines TEL2 on the base substrate substantially non-overlapping with the orthographic projection of the plurality of data lines DL on the base substrate, interference between data signals transmitted in the plurality of data lines DL and touch signals transmitted in the plurality of touch electrode lines can be significantly reduced.

In some embodiments, the plurality of second touch electrode lines TEL2 includes a plurality of first adjacent second touch electrode lines and a plurality of second adjacent second touch electrode lines alternately arranged. In some embodiments, an orthographic projection of a first adjacent second touch electrode line of the plurality of first adjacent second touch electrode lines on a base substrate is substantially covered by (e.g., at least 75% covered by, at least 80% covered by, at least 85% covered by, at least 90% covered by, at least 95% covered by, at least 99% covered by, or 100% covered by) an orthographic projection of an individual voltage supply line of the plurality of voltage supply lines Vdd on the base substrate. In some embodiments, an orthographic projection of a second adjacent second touch electrode line of the plurality of second adjacent second touch electrode lines on a base substrate at least partially (e.g., at least 50%, at least 60%, at least 70%, at least 80%, at least 90%, at least 95%, at least 99%, or 100%) overlaps with an orthographic projection of an individual constant voltage signal line of the plurality of constant voltage signal line Vc on the base substrate.

In some embodiments, a respective first touch electrode line of the plurality of first touch electrode lines TE1 crosses over at least one voltage supply line of the plurality of voltage supply lines Vdd and crosses over at least one constant voltage signal line of the plurality of constant voltage signal lines Vc. In some embodiments, the respective first touch electrode line does not cross over at least one data line of the plurality of data lines DL.

In some embodiments, the array substrate includes a plurality of line breaks LB where electrode lines of the plurality of first touch electrode lines TE1 discontinue. In some embodiments, an orthographic projection of an insulating material in a respective line break of the plurality of line breaks LB on a base substrate overlaps with an orthographic projection of an individual data line of the plurality of data lines DL on the base substrate.

In some embodiments, an orthographic projection of a respective first touch electrode line of the plurality of first touch electrode lines TE1 on a base substrate is non-overlapping with an orthographic projection of at least one data line of the plurality of data lines DL on the base substrate. In some embodiments, the orthographic projection of the respective first touch electrode line on the base substrate is non-overlapping with the orthographic projection of the at least one data line of the plurality of data lines DL on the base substrate where a line break of the plurality of line breaks LB is present. Optionally, the orthographic projection of the respective first touch electrode line on the base substrate at least partially overlaps with an orthographic projection of at least another data line of the plurality of data lines DL on the base substrate. Optionally, the orthographic projection of the respective first touch electrode line on the base substrate at least partially overlaps with the orthographic projection of the at least another data line of the plurality of data lines DL on the base substrate where the plurality of line breaks LB are absent.

The inventors of the present disclosure discover that, by having the orthographic projection of the respective first touch electrode line on the base substrate non-overlapping with the orthographic projection of at least one data line of the plurality of data lines DL on the base substrate, interference between data signals transmitted in the plurality of data lines DL and touch signals transmitted in the plurality of touch electrode lines can be further reduced.

Despite having the plurality of line breaks LB, touch electrode lines in an individual touch electrode block (e.g., a respective first mesh block of the plurality of first mesh blocks MB1 and a respective second mesh block of the plurality of second mesh blocks MB2 depicted in FIG. 10) remain interconnected. Portions of discontinued electrode fragments in a respective first touch electrode line are electrically connected by adjacent second touch electrode lines and one or more adjacent first touch electrode lines, as shown in FIG. 3N, and FIG. 11 to FIG. 13.

In some embodiments, an orthographic projection of at least one data line of the plurality of data lines DL on a base substrate at least partially (e.g., at least 50%, at least 60%, at least 70%, at least 80%, at least 90%, at least 95%, at least 99%, or 100%) overlaps with an orthographic projection of one or more anodes of the plurality of anodes on the base substrate. Optionally, the orthographic projection of at least one data line of the plurality of data lines DL on the base substrate at least partially overlaps with an orthographic projection of a column of anodes on the base substrate. Optionally, an orthographic projection of each data line of the plurality of data lines DL on a base substrate at least partially (e.g., at least 50%, at least 60%; at least 70%, at least 80%, at least 90%, at least 95%, at least 99%, or 100%) overlaps with an orthographic projection of one or more anodes of the plurality of anodes on the base substrate. Optionally, the orthographic projection of each data line of the plurality of data lines DL on the base substrate at least partially overlaps with an orthographic projection of a column of anodes on the base substrate.

In some embodiments, an orthographic projection of at least one data line of the plurality of data lines DL on a base substrate at least partially (e.g., at least 50%, at least 60%, at least 70%, at least 80%, at least 90%, at least 95%, at least 99%, or 100%) overlaps with an orthographic projection of a light emitting material in one or more subpixel apertures of the plurality of subpixel apertures SA on the base substrate. Optionally, the orthographic projection of at least one data line of the plurality of data lines DL on the base substrate at least partially overlaps with an orthographic projection of a light emitting material in a column of subpixel apertures on the base substrate. Optionally, an orthographic projection of each data line of the plurality of data lines DL on a base substrate at least partially (e.g., at least 50%, at least 60%, at least 70%, at least 80%, at least 90%, at least 95%, at least 99%, or 100%) overlaps with an orthographic projection of a light emitting material in one or more subpixel apertures of the plurality of subpixel apertures SA on the base substrate. Optionally, the orthographic projection of each data line of the plurality of data lines DL on the base substrate at least partially overlaps with an orthographic projection of a light emitting material in a column of subpixel apertures on the base substrate.

Figure 14:
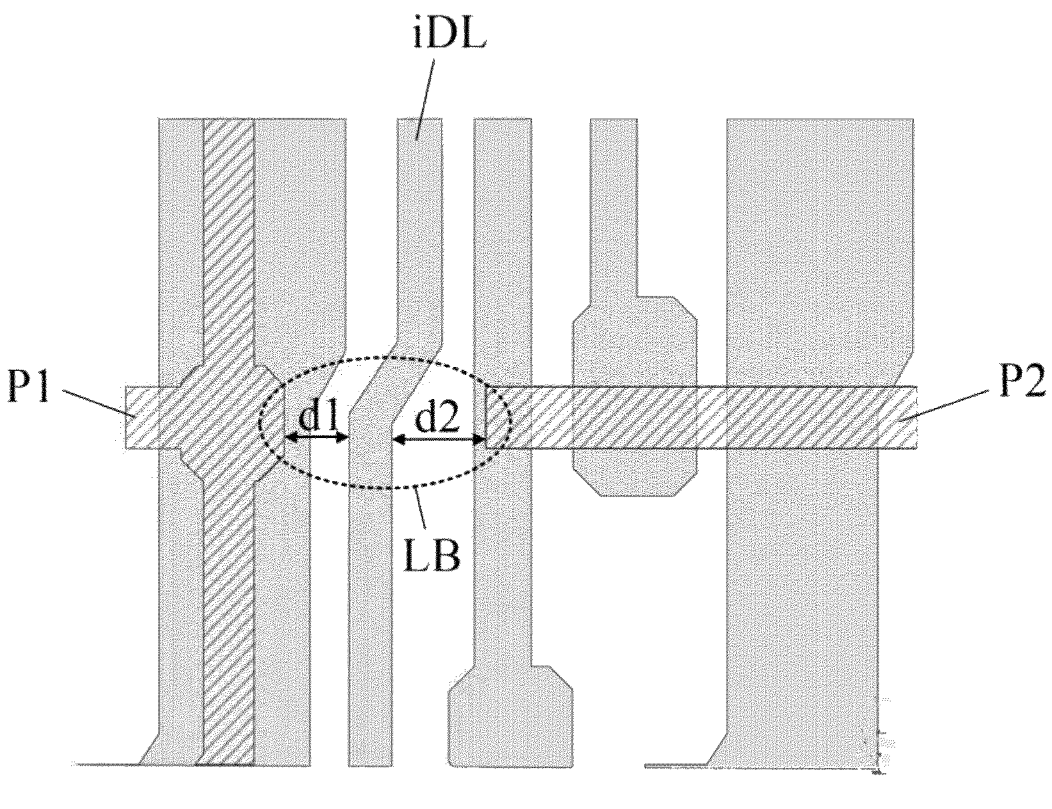
FIG. 14 is a zoom-in view of a touch electrode layer in a region having a line break.

FIG. 14 is a zoom-in view of a touch electrode layer in a region having a line break. Referring to FIG. 14, the respective first touch electrode line in some embodiments includes a first portion P1 and a second portion P2 spaced apart by a line break of the plurality of line breaks LB. An orthographic projection of the first portion P1 and the second portion P2 on a base substrate is non-overlapping with an orthographic projection of an individual data line iDL of the plurality of data lines on the base substrate, wherein the individual data line iDL extends through a region having the line break. Optionally, the first portion P1 is spaced apart from the individual data line iDL by a first minimum distance d1. Optionally, the second portion P2 is spaced apart from the individual data line iDL by a second minimum distance d2. Optionally, the first minimum distance d1 is greater than a threshold distance to minimize interference between data signals transmitted in the individual data line iDL and touch signals transmitted in the first portion P1. Optionally, the second minimum distance d2 is greater than a threshold distance to minimize interference between data signals transmitted in the individual data line iDL and touch signals transmitted in the second portion P2. Optionally, threshold distance is greater than 0.5 μm, e.g., greater than 0.5 μm, greater than 1.0 μm, greater than 1.5 μm, or greater than 2.0 μm. In one example, the threshold distance is 2.0 μm.

Figure 15:
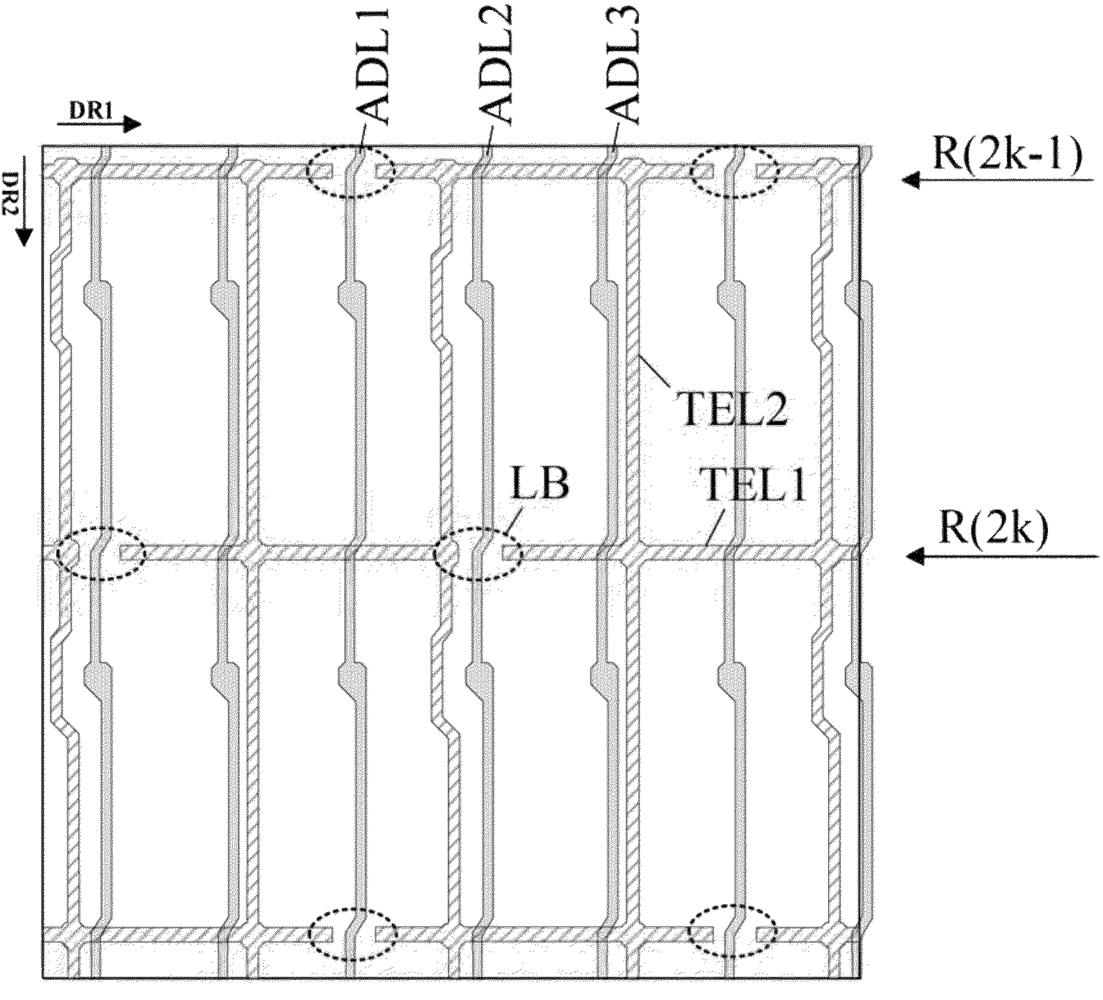
FIG. 15 is a diagram illustrating a layout of a plurality of touch electrode lines and a plurality of data lines in some embodiments according to the present disclosure.

FIG. 15 is a diagram illustrating a layout of a plurality of touch electrode lines and a plurality of data lines in some embodiments according to the present disclosure, Referring to FIG. 15, in some embodiments, the plurality of first touch electrode lines are arranged in rows, including (2k−1)-th row R(2k−1), and (2k)-th row R(2k) of K rows, K and k being positive integers, 1≤k≤(K/2). As used herein, the terms "(2k−1)-th row" and "(2k)-th row" are used in the context of the K rows. The touch electrode layer may or may not include additional row(s) before the first row of the K rows and/or additional rows after the last row of the K rows. In the context of the touch electrode layer, the term "(2k−1)-th row" does not necessarily denote an odd-numbered row, and the term "(2k)-th row" does not necessarily denote an even-numbered row. In one example, the (2k−1)-th row is an odd-numbered row in the context of the K rows, but may be an even-numbered row in the context of the touch electrode layer. In another example, the (2k−1)-th row is an odd-numbered row in the context of the K rows, and also an odd-numbered row in the context of the touch electrode layer. In one example, the (2k)-th row is an even-numbered row in the context of the K rows, but may be an odd-numbered row in the context of the touch electrode layer. In another example, the (2k)-th row is an even-numbered row in the context of the K rows, and also an even-numbered row in the context of the touch electrode layer.

In some embodiments, the plurality of data lines includes a first adjacent data line ADL1 and a second adjacent data line ADL2. In some embodiments, an orthographic projection of the first adjacent data line ADL1 on a base substrate at least partially overlaps with an orthographic projection of first touch electrode line(s) in the (2k)-th row R(2k) on the base substrate, and is non-overlapping with an orthographic projection of first touch electrode line(s) in the (2k−1)-th row R(2k−1) on the base substrate. In some embodiments, an orthographic projection of the second adjacent data line ADL2 on a base substrate at least partially overlaps with an orthographic projection of first touch electrode line(s) in the (2k−1)-th row R(2k−1) on the base substrate, and is non-overlapping with an orthographic projection of first touch electrode line(s) in the (2k)-th row R(2k) on the base substrate. The inventors of the present disclosure discover that, by having this structure, display mura in the array substrate can be significantly reduced.

In some embodiments, the plurality of data lines further includes a third adjacent data line ADL3. In some embodiments, an orthographic projection of the third adjacent data line ADL3 on a base substrate at least partially overlaps with an orthographic projection of first touch electrode line(s) in the (2k)-th row R(2k) on the base substrate, and at least partially overlaps with an orthographic projection of first touch electrode line(s) in the (2k−1)-th row R(2k−1) on the base substrate.

In some embodiments, the first adjacent data line ADL1, the second adjacent data line ADL2, and the third adjacent data line ADL3 are three data lines adjacent to each other. In one example, the first adjacent data line ADL1, the second adjacent data line ADL2, and the third adjacent data line ADL3 are sequentially arranged.

In some embodiments, line breaks in a first touch electrode line in the (2k)-th row R(2k) and line breaks in a first touch electrode line in the (2k−1)-th row R(2k−1) are staggered with respect to each other.

In some embodiments, a portion of a respective first touch electrode line of the plurality of first touch electrode lines TEL1 between two adjacent line breaks of the plurality of line breaks LB crosses over two data lines of the plurality of data lines DL. An orthographic projection of the portion of the respective first touch electrode line between the two adjacent line breaks of the plurality of line breaks LB on a base substrate at least partially overlaps with an orthographic projection of two data lines of the plurality of data lines DL on the base substrate.

In another aspect, the present invention provides a display apparatus, including the array substrate described herein or fabricated by a method described herein, and one or more integrated circuits connected to the array substrate. Examples of appropriate display apparatuses include, but are not limited to, an electronic paper, a mobile phone, a tablet computer, a television, a monitor, a notebook computer, a digital album, a GPS, etc. Optionally, the display apparatus is an organic light emitting diode display apparatus. Optionally, the display apparatus is a micro light emitting diode display apparatus. Optionally, the display apparatus is a mini light emitting diode display apparatus.

In another aspect, the present disclosure provides a method of fabricating an array substrate. In some embodiments, the method includes forming a plurality of data lines; and forming a touch electrode layer comprising a plurality of touch electrode lines on a side of the plurality of data lines away from a base substrate. Optionally, forming the plurality of touch electrode lines comprises forming a plurality of first touch electrode lines extending along a direction substantially parallel to a first direction and forming a plurality of second touch electrode lines extending along a direction substantially parallel to a second direction. Optionally, the plurality of data lines extend along a direction substantially parallel to the second direction. Optionally, the method further includes forming a plurality of line breaks where electrode lines of the plurality of first touch electrode lines discontinue. Optionally, an orthographic projection of an insulating material in a respective line break of the plurality of line breaks on the base substrate overlaps with an orthographic projection of an individual data line of the plurality of data lines on the base substrate. Optionally, where a line break of the plurality of line breaks is present, an orthographic projection of a respective first touch electrode line of the plurality of first touch electrode lines on the base substrate is non-overlapping with the orthographic projection of the individual data line on the base substrate.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An array substrate, comprising a plurality of data lines; and a touch electrode layer comprising a plurality of touch electrode lines on a side of the plurality of data lines away from a base substrate;

wherein the plurality of touch electrode lines comprise a plurality of touch electrode lines extending along a direction substantially parallel to a first direction and a plurality of second touch electrode lines extending along a direction substantially parallel to a second direction; and the plurality of data lines extend along a direction substantially parallel to the second direction;

wherein the array substrate comprises a plurality of line breaks where electrode lines of the plurality of first touch electrode lines discontinue;

an orthographic projection of an insulating material in a respective line break of the plurality of line breaks on the base substrate overlaps with an orthographic projection of an individual data line of the plurality of data lines on the base substate; and where a line break of the plurality of line breaks is present, an orthographic projection of a respective first touch electrode line of the plurality of first touch electrode lines on the base substrate is non-overlapping with the orthographic projection of the individual data line on the base substrate.

2. The array substrate of claim 1, wherein the plurality of line breaks are arranged in an array of rows and columns.

3. The array substrate of claim 1, wherein the plurality of first touch electrode lines are arranged in rows, including (2k−1)-th row R(2k−1), and (2k)-th row R(2k) of K rows, K and k being positive integers, 1≤k≤(K/2);

the plurality of data lines comprise a first adjacent data line and a second adjacent data line;

an orthographic projection of the first adjacent data line on the base substrate at least partially overlaps with an orthographic projection of first touch electrode lines in the (2k)-th row R(2k), and is non-overlapping with an orthographic projection of first touch electrode line in the (2k−1)-th row R(2k−1); and an orthographic projection of the second adjacent data line on the base substrate at least partially overlaps with an orthographic projection of first touch electrode lines in the (2k−1)-th row R(2k−1), and is non-overlapping with an orthographic projection of first touch electrode lines in the (2k)-th row R(2k).

4. The array substrate of claim 3, wherein the plurality of data lines further comprise a third adjacent data line; and an orthographic projection of the third adjacent data line on the base substrate at least partially overlaps with an orthographic projection of first touch electrode lines in the (2k)-th row R(2k), and at least partially overlaps with an orthographic projection of first touch electrode lines in the (2k−1)-th row R(2k−1).

5. The array substrate of claim 4, wherein the first adjacent data line, the second adjacent data line, and the third adjacent data line are three data lines adjacent to each other.

6. The array substrate of claim 3, wherein line breaks in a first touch electrode line in the (2k)-th row R(2k) and line breaks in a first touch electrode line in the (2k−1)-th row R(2k−1) are staggered with respect to each other.

7. The array substrate of claim 3, wherein a portion of the respective first touch electrode line between two adjacent line breaks of the plurality of line breaks crosses over two data lines of the plurality of data lines; and an orthographic projection of the portion of the respective first touch electrode line between the two adjacent line breaks of the plurality of line breaks on the base substrate at least partially overlaps with an orthographic projection of two data lines of the plurality of data lines on the base substrate.

8. The array substrate of claim 1, wherein the respective first touch electrode line comprises a first portion and a second portion spaced apart by a line break of the plurality of line breaks;

an orthographic projection of the first portion and the second portion on the base substrate is non-overlapping with an orthographic projection of the individual data line on the base substrate, wherein the individual data line extends through a region having the line break;

the first portion is spaced apart from the individual data line by a first minimum distance;

the second portion is spaced apart from the individual data line by a second minimum distance; and the first minimum distance and the second minimum distance are greater than 0.5 μm.

9. The array substrate of claim 1, wherein an orthographic projection of the plurality of second touch electrode lines on the base substrate is substantially non-overlapping with an orthographic projection of the plurality of data lines on the base substrate.

10. The array substrate of claim 9, further comprising a plurality of voltage supply lines and a plurality of constant voltage signal lines; and wherein an orthographic projection of the plurality of second touch electrode lines on the base substrate at least partially overlaps with an orthographic projection of a combination of the plurality of voltage supply lines and the plurality of constant voltage signal lines on the base substrate.

11. The array substrate of claim 10, wherein the plurality of second touch electrode lines comprise a plurality of first adjacent second touch electrode lines and a plurality of second adjacent second touch electrode lines alternately arranged;

wherein an orthographic projection of a first adjacent second touch electrode line of the plurality of first adjacent second touch electrode lines on the base substrate is substantially covered by an orthographic projection of an individual voltage supply line of the plurality of voltage supply lines on the base substate; and an orthographic projection of a second adjacent second touch electrode line of the plurality of second adjacent second touch electrode lines on the base substrate at least partially overlaps with an orthographic projection of an individual constant voltage signal line of the plurality of constant voltage signal on the base substate.

12. The array substrate of claim 10, wherein the respective first touch electrode line crosses over at least one voltage supply line of the plurality of voltage supply lines and crosses over at least one constant voltage signal line of the plurality of constant voltage signal lines.

13. The array substrate of claim 10, further comprising a plurality of first reset signal lines and a plurality of second reset signal lines in a layer on a side of the plurality of data lines closer to the base substrate;

wherein the plurality of constant voltage signal lines comprise a plurality of third reset signal lines;

wherein the array substrate comprises an interconnected reset signal network comprising the plurality of first reset signal lines, the plurality of second reset signal lines, and the plurality of third reset signal lines interconnected together;

the plurality of first reset signal lines and the plurality of second reset signal lines extend along a direction substantially parallel to the first direction, respectively;

the plurality of third reset signal lines extend along a direction substantially parallel to the second direction;

a respective first reset signal line is connected to one or more third reset signal lines of the plurality of third reset signal lines;

a respective second reset signal line is connected to one or more third reset signal lines of the plurality of third reset signal lines; and a respective third reset signal line of the plurality of third reset signal lines is connected to one or more first reset signal lines of the plurality of first reset signal lines and connected to one or more second reset signal lines of the plurality of second reset signal lines.

14. The array substrate of claim 13, wherein the plurality of first reset signal lines and the plurality of second reset signal lines are in a semiconductor material layer comprising active layers of one or more transistors of a pixel driving circuit; and the plurality of third reset signal lines are in a second signal line layer on a side of the semiconductor material layer away from the base substrate.

15. The array substrate of claim 1, further comprising a plurality of anodes;

wherein an orthographic projection of the plurality of touch electrode lines on the base substrate is substantially non-overlapping with an orthographic projection of the plurality of anodes of a plurality of light emitting elements on the base substrate.

16. The array substrate of claim 1, further comprising a plurality of anodes, and a pixel definition layer defining a plurality of subpixel apertures;

wherein an orthographic projection of the plurality of touch electrode lines on the base substrate is completely non-overlapping with an orthographic projection of a light emitting material in the plurality of subpixel apertures on the base substrate.

17. The array substrate of claim 16, wherein an orthographic projection of each data line of the plurality of data lines on the base substrate at least partially overlaps with an orthographic projection of a column of anodes of the plurality of anodes on the base substrate.

18. The array substrate of claim 16, wherein an orthographic projection of each data line of the plurality of data lines on the base substrate at least partially overlaps with an orthographic projection of a light emitting material in a column of subpixel apertures of the plurality of subpixel apertures on the base substrate.

19. The array substrate of claim 1, wherein touch electrode lines in a same touch electrode block remain interconnected despite having the plurality of line breaks; and portions of discontinued electrode fragments in the respective first touch electrode line are electrically connected together by adjacent second touch electrode lines and one or more adjacent first touch electrode lines.

20. A display apparatus, comprising the array substrate of claim 1, and one or more integrated circuits connected to the array substrate.

* * * * *